(12) United States Patent
Hiraoka et al.

(10) Patent No.: US 9,040,968 B2
(45) Date of Patent: May 26, 2015

(54) METHOD FOR MANUFACTURING ORGANIC ELECTROLUMINESCENCE DEVICE AND ORGANIC ELECTROLUMINESCENCE DEVICE

(75) Inventors: Tomomi Hiraoka, Hyogo (JP); Yasuo Segawa, Hyogo (JP)

(73) Assignee: JOLED INC, Tokyo (JP)

( * ) Notice: Subject to any disclaimer, the term of this patent is extended or adjusted under 35 U.S.C. 154(b) by 0 days.

(21) Appl. No.: 14/005,687

(22) PCT Filed: Apr. 20, 2011

(86) PCT No.: PCT/JP2011/002324
§ 371 (c)(1),
(2), (4) Date: Sep. 17, 2013

(87) PCT Pub. No.: WO2012/143974
PCT Pub. Date: Oct. 26, 2012

(65) Prior Publication Data
US 2014/0008625 A1     Jan. 9, 2014

(51) Int. Cl.
*H01L 51/56* (2006.01)
*H05B 33/10* (2006.01)
*H01L 51/52* (2006.01)

(52) U.S. Cl.
CPC ............ *H01L 51/56* (2013.01); *H01L 2251/568* (2013.01); *H01L 51/5203* (2013.01); *H05B 33/10* (2013.01)

(58) Field of Classification Search
CPC ............ H01L 51/0545; H01L 51/0036; H01L 51/0541; H01L 51/5012; H01L 27/1214; H01L 51/56; B82Y 10/00; B82Y 30/00; Y02E 10/50

USPC ........................................ 257/40; 438/82, 99
See application file for complete search history.

(56) References Cited

U.S. PATENT DOCUMENTS 7,234,984 B2    6/2007  Nishikawa et al.
7,258,586 B2    8/2007  Tamura et al.
(Continued)

FOREIGN PATENT DOCUMENTS

JP      11-129084       5/1999
JP      2003-178871     6/2003
(Continued)

OTHER PUBLICATIONS

Japan Office action in Japan Patent Application No. 2013-510739, mail date is Sep. 30, 2014.
(Continued)

*Primary Examiner* — Steven Loke
*Assistant Examiner* — Didarul Mazumder
(74) *Attorney, Agent, or Firm* — Greenblum & Bernstein, P.L.C.

(57) ABSTRACT

A method for manufacturing an organic electroluminescence device includes: preparing the organic electroluminescence device that includes a lower electrode, an organic layer including a light-emitting layer and formed on the lower electrode, an upper electrode formed on the organic layer, and an encapsulating layer formed on the upper electrode, and has a part in which the lower electrode and the upper electrode are shorted; and forming a mixed layer in which a constituent material of the upper electrode and at least one of constituent materials of the organic layer and the thin-film encapsulating layer which are adjacent to the upper electrode are mixed, by irradiating at least one of the shorted part and a region around the shorted part with an ultrashort pulse laser.

19 Claims, 27 Drawing Sheets

(56) References Cited

U.S. PATENT DOCUMENTS

| | | |
|---|---|---|
| 7,611,745 B2 | 11/2009 | Nishikawa et al. |
| 8,415,174 B2 | 4/2013 | Tanaka |
| 8,518,719 B2 | 8/2013 | Hiraoka et al. |
| 2003/0222861 A1 | 12/2003 | Nishikawa et al. |
| 2004/0202777 A1 | 10/2004 | Nishikawa et al. |
| 2005/0215163 A1 | 9/2005 | Tamura et al. |
| 2006/0214575 A1* | 9/2006 | Kajiyama et al. ............ 313/506 |
| 2008/0233826 A1* | 9/2008 | Matsuda ........................ 445/2 |
| 2011/0027918 A1 | 2/2011 | Tanaka |
| 2011/0278603 A1 | 11/2011 | Miyazawa et al. |
| 2013/0248844 A1 | 9/2013 | Hiraoka |
| 2013/0320323 A1 | 12/2013 | Segawa et al. |

FOREIGN PATENT DOCUMENTS

| | | |
|---|---|---|
| JP | 2004-227852 | 8/2004 |
| JP | 2005-276600 | 10/2005 |
| JP | 2008-235177 | 10/2008 |
| JP | 2009-266917 | 11/2009 |
| JP | 2011-49159 | 3/2011 |
| WO | 2010/092749 | 8/2010 |

OTHER PUBLICATIONS

International Search Report and Written Opinion for PCT/JP2011/002324, mail date is Jun. 7, 2011, along with an English translation of ISR.

International Preliminary Report on Patentability, dated Nov. 27, 2012.

* cited by examiner

METHOD FOR MANUFACTURING ORGANIC ELECTROLUMINESCENCE DEVICE AND ORGANIC ELECTROLUMINESCENCE DEVICE

TECHNICAL FIELD

The present invention relates to methods for manufacturing organic electroluminescence devices and organic electroluminescence devices.

BACKGROUND ART

Conventionally, in an organic electroluminescence (hereinafter referred to as organic EL) device composed of an anode, a cathode, and an organic layer between the anode and the cathode, there is a technique for repairing (fixing) a shorted part by irradiating the shorted part with the laser when the anode and the cathode are shorted due to a conductive foreign material being attached to or mixed into the organic EL device in the manufacturing process (for example, see Patent Literatures 1 to 4).

In Patent Literature 1, a conductive foreign material attached to the organic EL device is detected, and the organic layer in a region around the foreign material is irradiated with the laser. With this, the organic layer of the organic EL device with the foreign material attached thereto between the anode and the cathode is insulated so as to form a high resistance region which fixes the anode-to-cathode short caused by the foreign material.

In Patent Literature 2, a part shorted by the foreign material is irradiated with the laser before forming a protective film above the anode and the cathode. With this, the anode-to-cathode short caused by the foreign material is fixed by melting the foreign material itself for changing its shape or burning the foreign material itself.

In Patent Literature 3, the anode-to-cathode short caused by the foreign material is fixed by cutting, with the laser, the cathode in a part where the anode and the cathode are shorted by the foreign material from the cathode in a non-shorted part so as to physically separate the parts.

In Patent Literature 4, the short is fixed by forming a defective part by irradiating a part of the organic EL device where a bright point is missing with a laser beam such as a femtosecond laser.

CITATION LIST

Patent Literature

[Patent Literature 1] Japanese Unexamined Patent Application Publication No. 2004-227852
[Patent Literature 2] Japanese Unexamined Patent Application Publication No. 2003-178871
[Patent Literature 3] Japanese Unexamined Patent Application Publication No. 2005-276600
[Patent Literature 4] Japanese Unexamined Patent Application Publication No. 2008-235177

SUMMARY OF INVENTION

Technical Problem

As illustrated in Patent Literature 1, a method for fixing the short between the anode and the cathode by insulating the organic layer around the foreign material by irradiating the organic layer with the laser insulates the organic layer around the foreign material. Accordingly, this method is effective in fixing the short when the size of the foreign material is smaller than the thickness of the organic layer. However, if the size of the foreign material is greater than or equal to the thickness of the organic layer, there is a problem that it is difficult to fix the short between the anode and the cathode in the above method.

Furthermore, as illustrated in Patent Literature 2, a method for breaking the foreign material by directly irradiating the foreign material with the laser is conceivable. However, there is a possibility that the foreign material irradiated with the laser absorbs the energy of the laser and shakes, resulting in the breakage of the anode and the cathode of the organic EL device, and damaging the entire panel due to degradation (oxidation) caused by exposure of the light-emitting layer and the cathode to oxygen and moisture from the broken part.

Furthermore, as illustrated in Patent Literature 3, in a method for physically separating a part around the short between the anode and the cathode by cutting the part off with the laser, the organic layer in the isolated region around the foreign material does not emit light, resulting in a dark spot. In addition, there is a possibility that the entire panel is damaged.

Furthermore, as illustrated in Patent Literature 4, in a method for fixing the short by forming the defective part, there may be an extensive damage to a part around the defective part when forming the defective part by the laser irradiation.

In view of the above problems, it is an object of the present invention to provide a method for manufacturing an organic electroluminescence device capable of reducing the occurrence of the damage caused by the laser irradiation and securely fixing the short between the anode and the cathode, and to provide the organic electroluminescence device.

Solution to Problem

In order to solve the above problems, the method for manufacturing an organic electroluminescence device according to an aspect of the present invention includes: preparing an organic electroluminescence device that has a shorted part and includes a lower electrode, an organic layer formed on the lower electrode, an upper electrode formed on the organic layer, and an encapsulating layer formed on the upper electrode, the shorted part being a part in which the lower electrode and the upper electrode are shorted, the organic layer including a light-emitting layer; and forming a mixed layer by irradiating at least one of the shorted part and a region around the shorted part with a laser, the mixed layer being a layer in which a constituent material of the upper electrode and at least one of (i) a constituent material of the organic layer and (ii) a constituent material of the encapsulating layer are mixed.

Advantageous Effects of Invention

According to the method for manufacturing an organic electroluminescence device and the organic electroluminescence device according to the present invention, it is possible to securely fix the short between the anode and the cathode while reducing the occurrence of the damage caused by the laser irradiation.

DESCRIPTION OF EMBODIMENTS

Figure 1:
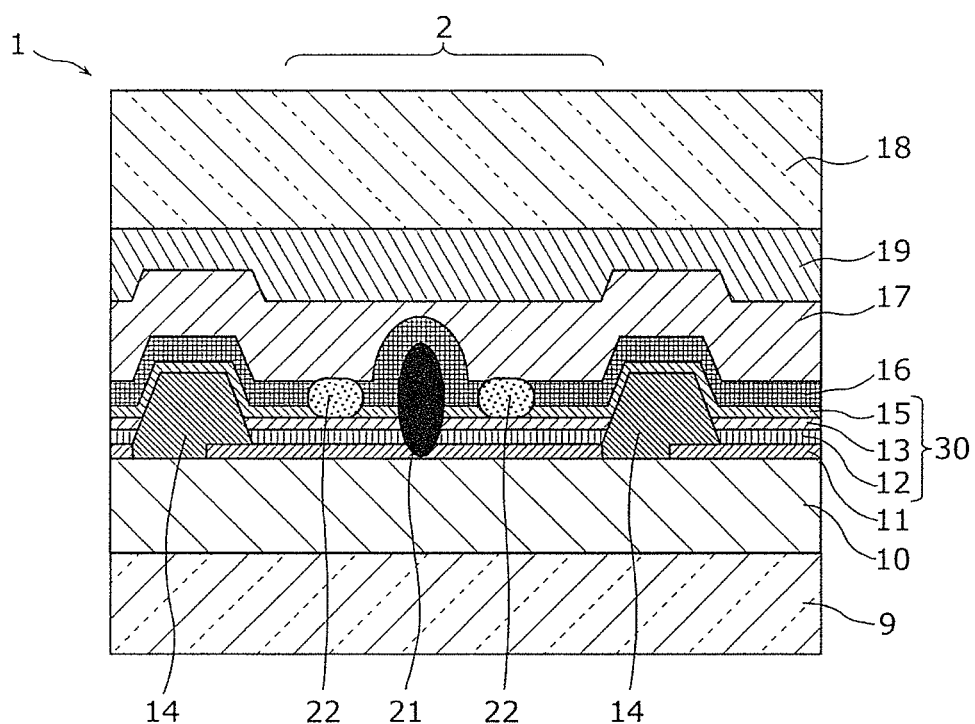
FIG. 1 is a cross-sectional schematic view of an organic EL device according to Embodiment 1.

The method for manufacturing an organic electroluminescence device according to the present invention includes: preparing an organic electroluminescence device that has a shorted part and includes a lower electrode, an organic layer formed on the lower electrode, an upper electrode formed on the organic layer, and an encapsulating layer formed on the upper electrode, the shorted part being a part in which the lower electrode and the upper electrode are shorted, the organic layer including a light-emitting layer; and forming a mixed layer by irradiating at least one of the shorted part and a region around the shorted part with a laser, the mixed layer being a layer in which a constituent material of the upper electrode and at least one of (i) a constituent material of the organic layer and (ii) a constituent material of the encapsulating layer are mixed.

According to this aspect, any one of the following mixed layers is formed by laser irradiation: a mixed layer in which the constituent material of the upper electrode and the constituent material of the organic layer adjacent to the upper electrode are mixed; a mixed layer in which the constituent material of the upper electrode and the constituent material of the encapsulating layer are mixed; and a mixed layer in which the constituent material of the upper electrode and the constituent materials of the organic layer and the encapsulating layer which are adjacent to the upper electrode are mixed. Here, it is conceived that the resistance value of the mixed layer is high because the density of a conductive material (metal atoms) included in the negative electrode is low due to the presence of the constituent materials of the negative electrode, the organic layer, and the thin-film encapsulating layer in mixture. Thus, at least one of the shorted part and the part around the shorted part can be set high in resistance, with the result that a defective device having the shorted part can be repaired to obtain a device which is capable of emitting light.

Furthermore, it may be that the mixed layer is formed at least at a position corresponding to the upper electrode which has not been irradiated with the laser.

According to an aspect, forming the mixed layer at a position corresponding to the upper electrode causes at least one of the shorted part and the part around the shorted part to be set high in resistance, which allows the short to be fixed.

Furthermore, it may be that the upper electrode includes a metal or a metal oxide, and a proportion of metal atoms in the mixed layer is lower than a proportion of metal atoms in the upper electrode which has not been irradiated with the laser.

According to an aspect, the proportion of the metal atoms in the mixed layer formed by the laser irradiation is lower than the proportion of the metal atoms in the upper electrode which has not been irradiated with a laser, with the result that the metal atoms diffuse from the upper electrode toward the organic layer. This allows at least one of the shorted part and the part around the shorted part to be set high in resistance, which allows the short to be fixed.

Furthermore, it may be that a proportion of carbon atoms in the mixed layer is higher than a proportion of carbon atoms in the upper electrode which has not been irradiated with the laser.

According to this aspect, the proportion of the carbon atoms in the mixed layer formed by laser irradiation is higher than the proportion of the carbon atoms in the upper electrode which has not been irradiated with a laser, with the result that the carbon atoms diffuse from the organic layer toward the upper electrode. This allows at least one of the shorted part and the part around the shorted part to be set high in resistance, which allows the short to be fixed.

Furthermore, it may be that the encapsulating layer includes a material containing nitrogen, and a proportion of nitrogen atoms in the mixed layer is higher than a proportion of nitrogen atoms in the upper electrode which has not been irradiated with the laser.

According to this aspect, the proportion of the nitrogen atoms in the mixed layer formed by laser irradiation is higher than the proportion of the nitrogen atoms in the upper electrode which has not been irradiated with a laser, with the result that the nitrogen atoms diffuse from the encapsulating layer including a material containing nitrogen toward the upper electrode. This allows at least one of the shorted part and the part around the shorted part to be set high in resistance, which allows the short to be fixed.

Furthermore, it may be that the mixed layer includes a cavity.

According to this aspect, the laser irradiation gasifies a part of the mixed layer and thereby forms a cavity therein, with the result that a mixed layer having higher resistance can be formed.

Furthermore, it may be that at least one of (i) the constituent material of the organic layer and (ii) the constituent material of the encapsulating layer is present in a part of the cavity.

Furthermore, it may be that a sheet resistance value of the mixed layer is 1 Mega-ohm per square or more.

According to this aspect, the sheet resistance value of the mixed layer is set to 1 Mega-ohm per square or more to make the resistance value of the mixed layer higher than the resistance value of the organic layer, which allows the short to be fixed.

Furthermore, it may be that the laser is an ultrashort pulse laser.

Furthermore, it may be that the ultrashort pulse laser has a pulse width of 100 fs to 20 ps.

According to this aspect, the pulse time of the ultrashort pulse laser with which the organic layer is irradiated is set to be short, with the result that the resistance of the shorted part can be higher with the damage to the organic layer reduced.

Furthermore, it may be that the laser has a wavelength of 900 to 2,500 nm.

According to this aspect, the resistance of the shorted part can be higher with the damage to the organic layer reduced.

Furthermore, an organic electroluminescence device according to an aspect of the present invention includes: a lower electrode; an organic layer including a light-emitting layer and formed on the lower electrode; an upper electrode formed on the organic layer; an encapsulating layer formed on the upper electrode; and a mixed layer formed by laser irradiation and in which a constituent material of the upper electrode and at least one of (i) a constituent material of the organic layer and (ii) a constituent material of the encapsulating layer are mixed.

According to this aspect, any one of the following mixed layers is formed by laser irradiation: a mixed layer in which the constituent material of the upper electrode and the constituent material of the organic layer adjacent to the upper electrode are mixed; a mixed layer in which the constituent material of the upper electrode and the constituent material of the encapsulating layer are mixed; and a mixed layer in which the constituent material of the upper electrode and the constituent materials of the organic layer and the encapsulating layer which are adjacent to the upper electrode are mixed. Thus, at least one of the shorted part and the part around the shorted part can be set high in resistance, with the result that a defective device having the shorted part can be repaired to obtain a device which is capable of emitting light.

Furthermore, it may be that the mixed layer is formed at least at a position corresponding to the upper electrode which has not been irradiated with the laser.

According to an aspect, forming the mixed layer at a position corresponding to the upper electrode causes at least one of the shorted part and the part around the shorted part to be set high in resistance, which allows the short to be fixed.

Furthermore, it may be that the upper electrode includes a metal or a metal oxide, and a proportion of metal atoms in the mixed layer is lower than a proportion of metal atoms in the upper electrode.

According to an aspect, the proportion of the metal atoms in the mixed layer formed by the laser irradiation is lower than the proportion of the metal atoms in the upper electrode which has not been irradiated with a laser, with the result that the metal atoms diffuse from the upper electrode toward the organic layer. This allows at least one of the shorted part and the part around the shorted part to be set high in resistance, which allows the short to be fixed.

Furthermore, it may be that a proportion of carbon atoms in the mixed layer is higher than a proportion of carbon atoms in the upper electrode.

According to this aspect, the proportion of the carbon atoms in the mixed layer formed by laser irradiation is higher than the proportion of the carbon atoms in the upper electrode which has not been irradiated with a laser, with the result that the carbon atoms diffuse from the organic layer toward the upper electrode. With this, the mixed layer makes the upper electrode in the shorted part high in resistance, which allows the short to be fixed.

Furthermore, it may be that the encapsulating layer includes a material containing nitrogen, and a proportion of nitrogen atoms in the mixed layer is higher than a proportion of nitrogen atoms in the upper electrode.

According to this aspect, the proportion of the nitrogen atoms in the mixed layer formed by laser irradiation is higher than the proportion of the nitrogen atoms in the upper electrode which has not been irradiated with a laser, with the result that the nitrogen atoms diffuse from the encapsulating layer including a material containing nitrogen toward the upper electrode. This allows at least one of the shorted part and the part around the shorted part to be set high in resistance, which allows the short to be fixed.

Furthermore, it may be that the mixed layer includes a cavity.

According to this aspect, the laser irradiation gasifies a part of the mixed layer and thereby forms a cavity therein, with the result that a mixed layer having higher resistance can be formed.

Furthermore, it may be that at least one of (i) the constituent material of the organic layer and (ii) the constituent material of the encapsulating layer is present in a part of the cavity.

Furthermore, it may be that a sheet resistance value of the mixed layer is 1 Mega-ohm per square or more.

According to this aspect, the sheet resistance value of the mixed layer is set to 1 Mega-ohm per square or more to make the resistance value of the mixed layer higher than the resistance value of the organic layer, which allows the short to be fixed.

Note that, in the present invention, the proportions of the metal atoms, the carbon atoms, and the nitrogen atoms in each of the electrode and the mixed layer are measured based on the intensity of Auger electrons obtained by Auger spectroscopy.

A method for manufacturing an organic EL device and the organic EL device according to the embodiments of the present invention shall be described below with reference to the drawings. Note that, in the following description, elements that are the same or corresponding over all of the drawings are assigned with the same reference numerals, and overlapping description shall be omitted.

Embodiment 1

Embodiment 1 according to the present invention shall be described below with reference to the drawings.

FIG. 1 is a cross-sectional schematic view of an organic EL device 1 manufactured by a method for manufacturing the organic EL device according to this embodiment. The organic EL device 1 in FIG. 1 is an organic functional device having an organic layer including an anode, a cathode, and a light-emitting layer interposed between the anode and the cathode.

As illustrated in FIG. 1, the organic EL device 1 includes, on and above a transparent glass 9, a planarizing film 10, an anode 11, a hole injection layer 12, a light-emitting layer 13, a bank 14, an electron injection layer 15, a cathode 16, a thin-film encapsulating layer 17, an encapsulating resin layer 19, and a transparent glass 18. The anode 11 and the cathode 16 correspond to the lower electrode and the upper electrode according to the present invention, respectively. The hole injection layer 12, the light-emitting layer 13, and the electron injection layer 15 correspond to the organic layer according to the present invention.

The transparent glasses 9 and 18 are substrates for protecting the bottom and a light-emitting surface of the light-emitting panel, and each is a transparent alkali-free glass having a thickness of 0.5 mm, for example.

The planarizing film 10 includes an insulating organic material, for example, and is formed on a substrate including thin-film transistors (TFT) for driving.

The anode 11 is an anode where holes are supplied, that is, current flows in from an external circuit, and has a structure in which a reflective electrode including Al or silver alloy APC is stacked on the planarizing film 10, for example. The thickness of the reflective electrode is 10 to 40 nm, for example. Note that the anode 11 may have a two-layered structure including indium tin oxide (ITO), silver alloy APC, and others.

The hole injection layer 12 is a layer having a hole injecting material as the main component. The hole injecting material is a material having a function of injecting holes injected from the side of the anode 11, into the light-emitting layer 13 stably or by supporting generation of the holes. For example, compounds such as poly(3,4-ethylenedioxythiophene) (PEDOT), aniline, and others are used as the hole injection material.

The light-emitting layer 13 is a layer which emits light by voltage applied between the anode 11 and the cathode 16, and has a structure in which α-NPD (Bis[N-(1-naphthyl)-N-phenyl]benzidine) is stacked as the lower layer and Alq3(tris-(8-hydroxyquinoline)aluminum) is stacked as the upper layer, for example.

The electron injection layer 15 is a layer having an electron injecting material as the main component. The electron injecting material is a material having a function of injecting electrons injected from the cathode 16, into the light-emitting layer 13 stably or by supporting generation of the electrons. For example, polyphenylene vinylene (PPV) is used as the electron injecting material.

The cathode 16 is a cathode where electrons are supplied, that is, current flows toward the external circuit, and has a stacked structure of ITO which is a transparent metal oxide, for example. The cathode 16 may be formed by a material such as Mg, Ag, or others. The thickness of the electrode is 10 to 40 nm, for example.

The bank 14 is a wall for separating the light-emitting layer 13 into multiple light-emitting regions, and includes a photosensitive resin, for example.

The thin-film encapsulating layer 17 includes silicon nitride (SiN), for example, and has a function of blocking the light-emitting layer 13 and the cathode 16 from moisture and oxygen. This is for preventing degradation (oxidation) of the light-emitting layer 13 itself or the cathode 16 due to exposure to moisture and oxygen.

The encapsulating resin layer 19 is acrylic or epoxy resin, and has a function of joining the transparent glass 18 and an integral layer from the planarizing film 10 to the thin-film encapsulating layer 17 formed on and above the above-described substrate.

The configuration including the anode 11, the light-emitting layer 13, and the cathode 16 is the basic configuration of the organic EL device. With this configuration, when appropriate voltage is applied between the anode 11 and the cathode 16, holes are injected into the light-emitting layer 13 from the side of the anode 11, and electrons are injected into the light-emitting layer 13 from the side of the cathode 16. The energy generated by the recombination of the injected holes and electrons in the light-emitting layer 13 excites the light-emitting material in the light-emitting layer 13 to emit light.

Note that the materials for the hole injection layer 12 and the electron injection layer 15 are not limited by this embodiment, and as the materials, well-known organic materials or inorganic materials are used.

As alternatives to the configuration of the organic EL device 1, a hole transport layer may be present between the hole injection layer 12 and the light-emitting layer 13, and an electron transport layer may be present between the electron injection layer 15 and the light-emitting layer 13. The hole transport layer is a layer having a hole transporting material as the main component. The hole transporting material is a material which has both a property of being likely to become positive ions (holes) due to its electron donor property and a property of transmitting the generated holes by molecule-to-molecule electron transfer reactions, and is suitable for the charge transfer from the anode 11 to the light-emitting layer 13. The electron transport layer is a layer having an electron transporting material as the main component. The electron transporting material is a material which has both a property of being likely to become negative ions due to its electron acceptor property and a property of transmitting the generated electrons by molecule-to-molecule electron transfer reactions, and is suitable for the charge transfer from the cathode 16 to the light-emitting layer 13.

The organic EL device 1 may further include a color filters for adjusting colors in red, green, and blue under the transparent glass 18 so as to cover the light-emitting regions isolated by the bank 14.

Note that, in this embodiment, the hole injection layer 12, the light-emitting layer 13, and the electron injection layer 15 are collectively referred to as an organic layer 30. Furthermore, when the hole transport layer and the electron transport layer are included, these layers are included in the organic layer 30 as well. The thickness of the organic layer 30 is from 100 to 200 nm, for example. The pixel 2 refers to the planarizing film 10, the anode 11, the organic layer 30, the cathode 16, the thin-film encapsulating layer 17, and the transparent glass 18 arranged in the light-emitting region isolated by the bank 14.

Furthermore, the organic EL device 1 illustrated in FIG. 1 includes a conductive foreign material 21 between the anode 11 and the cathode 16 entered during the manufacturing process, and the anode 11 and the cathode 16 are shorted through the foreign material 21. With resistance increased by forming the mixed layer 22 in which a constituent material of ITO included in the cathode 16 that is the upper electrode at the position where the foreign material 21 is present and at least one of the constituent materials of the organic layer 30 and the thin-film encapsulating layer 17 which are adjacent to the cathode 16 are mixed, the short between the anode 11 and the cathode 16 by the foreign material 20 is fixed (repaired). The process of repairing the shorted part shall be described later.

Next, the method for manufacturing the organic EL device 1 shall be described.

Figure 2:
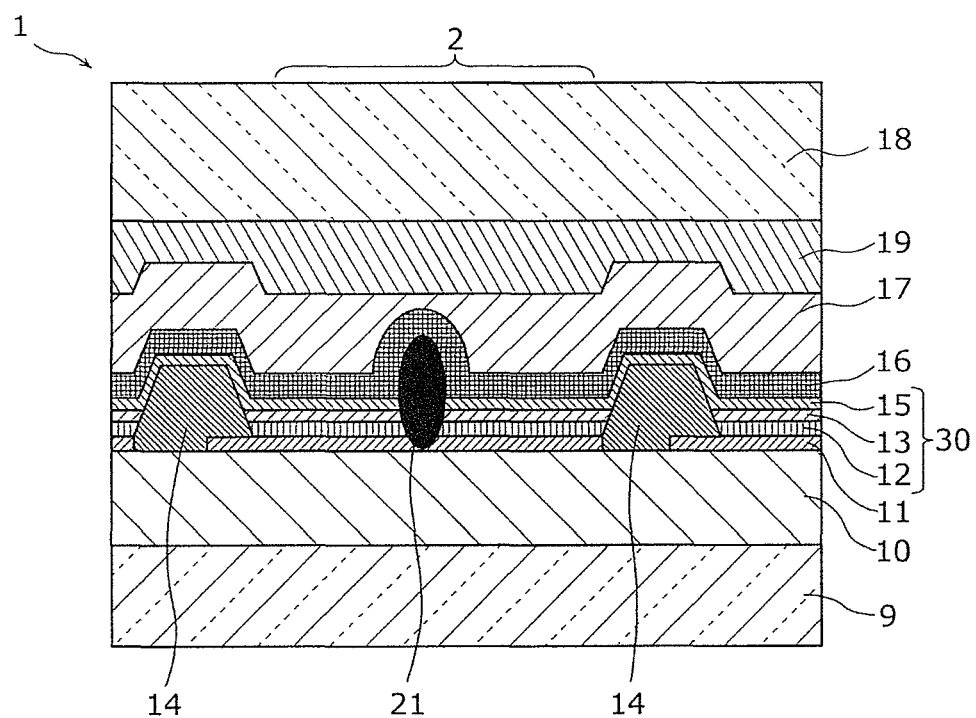
FIG. 2 is a cross-sectional schematic view illustrating a process of fixing a short of the organic EL device.

First, the process of forming the organic EL device shall be described. FIG. 2 is a cross-sectional schematic view of an organic EL device prepared in the first process in this embodiment, and illustrates a cross-sectional structure of the shorted organic EL device. First, on a substrate including TFT, the planarizing film 10 including an insulating organic material is formed, and the anode 11 is formed on the planarizing film 10.

The anode 11 is formed by, for example, depositing a 30-nm thick layer of Al by sputtering on the planarizing film 10 and then treating the layer in a patterning process including photolithography and wet etching.

The hole injection layer 12 is formed by, for example, solving PEDOT in a xylene-containing solvent and then applying this PEDOT solution onto the anode 11 by spin coating.

Next, on the hole injection layer 12, α-NPD and Alq3 are stacked by vapor deposition, for example, resulting in the light-emitting layer 13.

After that, the electron injection layer 15 is formed by, for example, solving polyphenylene vinylene (PPV) in, for example, a xylene- or chloroform-containing solvent and then applying this solution onto the light-emitting layer 13 by spin coating.

Subsequently, the cathode 16 is formed without exposing to the air the substrate on which the electron injection layer 15 has been formed. More specifically, on the electron injection layer 15, a 35-nm thick layer of ITO is stacked by sputtering, resulting in the cathode 16. Here, the cathode 16 is in the amorphous state.

The organic EL device having a function as the light-emitting device is formed by the manufacturing process described above. Note that the bank 14 including a surface photosensitive resin is formed at a predetermined position between the process of forming the anode 11 and the process of forming the hole injection layer 12.

Next, the thin-film encapsulating layer 17 is formed by stacking a 500-nm thick layer of silicon nitride on the cathode 16 by the plasma CVD, for example. The thin-film encapsulating layer 17 is formed in contact with the surface of the cathode 16. Accordingly, it is preferable to raise the requirement as the protective film, and a non-oxygen series inorganic material represented by silicon nitride described above is preferable. Furthermore, for example, the configuration may include an oxygen series inorganic material, such as silicon oxide ($Si_xO_Y$) or silicon oxynitride ($Si_xO_YN_Z$), or multiple layers of such inorganic materials. Furthermore, the forming method may not be limited to the plasma CVD, but may be another method such as sputtering using argon plasma.

Next, the encapsulating resin layer 19 is applied onto the surface of the thin-film encapsulating layer 17. Subsequently, the transparent glass 18 is placed on the encapsulating resin layer 19 applied. Here, in the case of the organic EL device 1 including color filters, the color filters are formed on the main surface of the transparent glass 18 in advance. Subsequently, the transparent glass 18 is placed on the encapsulating resin layer 19 applied, with the surface on which the color filters are formed facing downward. Note that the thin-film encapsulating layer 17, the encapsulating resin layer 19, and the transparent glass 18 correspond to the protective layer.

Finally, the transparent glass 18 is pressed downward from the upper surface side, and heat or energy line is applied so as to cure the encapsulating resin layer 19, bonding the transparent glass 18 and the thin-film encapsulating layer 17.

The organic EL device 1 illustrated in FIG. 2 is formed by the forming method described above.

Note that the forming processes of the anode 11, the hole injection layer 12, the light-emitting layer 13, the electron injection layer 15, and the cathode 16 are not limited by this embodiment.

FIG. 2 is a cross-sectional schematic view of the organic EL device 1 in which the conductive foreign material 21 is present between the anode 11 and the cathode 16, and the anode 11 and the cathode 16 are shorted through the foreign material 21. The foreign material 21 is, for example, a result of Al which is the material for the anode 11 being adhered to the anode 11 after the anode 11 is formed, followed by stacking of the hole injection layer 12, the light-emitting layer 13, the electron injection layer 15, and the cathode 16. The size of the foreign material 21 is approximately 200 nm in diameter and 500 nm in height, for example. Since the anode 11 and the cathode 16 are shorted by the foreign material 21, the organic EL device does not emit light from this pixel 2 which is a dark spot pixel.

Figure 3:
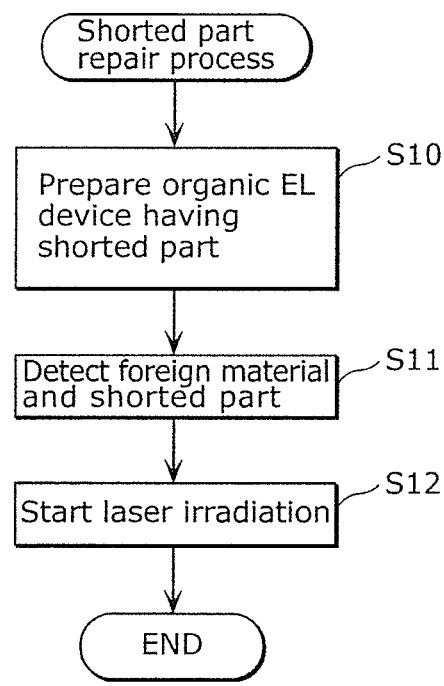
FIG. 3 is a flowchart illustrating a process in a method for manufacturing an organic EL device according to Embodiment 1.

Next, with regard to the organic EL device 1 in which the anode 11 and the cathode 16 are shorted by the foreign material 21 described above, a process of repairing the shorted part shall be described. FIG. 3 is a flowchart illustrating a process of fixing the short of the organic EL device.

The shorted part is repaired by irradiating the cathode 16 with the laser through the transparent glass 18. More specifically, an organic EL device having a shorted part is prepared (Step S10), a part shorted by the foreign material 21 or the present foreign material 21 itself is detected (Step S11), and the laser emission from the transparent glass 18 side to the cathode 16 at a part above the shorted part in the pixel 2 is started (Step S12). By doing so, the mixed layer 22 is formed in which ITO included in a part of the cathode 16 which has been irradiated with a laser and at least one of (i) the constituent material of the adjacent organic layer 30 (such as the electron transport layer and the electron injection layer) and (ii) the constituent material of the thin-film encapsulating layer 17 (such as resin) are mixed, which fixes the short between the anode 11 and the cathode 16.

The part where the anode 11 and the cathode 16 are shorted or the foreign material 21 is detected by detecting, visually or using a luminance measurement device, a pixel having luminance lower than the light-emission luminance of a regular pixel after a luminance signal voltage corresponding to an intermediate luminance tone is provided to each of the pixels 2, for example. Note that the method for detecting the shorted part or the foreign material 21 is not limited to the method described above and it may be that, for example, a value of current flowing between the anode 11 and the cathode 16 of the organic EL device is measured and based on the value of current, the detection is performed. In this case, the part where a current value equivalent to that at the regular pixel is obtained when a forward-bias voltage is applied thereto while leakage light emission is observed when a reverse-bias voltage is applied thereto may be determined as a shorted part or a part where the foreign material 21 is present.

Figure 4:
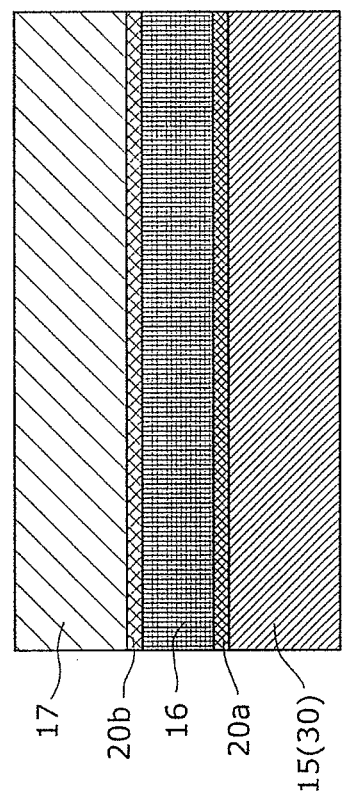
FIG. 4 is a partial cross-sectional view of an organic EL device which has not been irradiated with a laser in Embodiment 1.

Here, differences of the cathode 16, the organic layer 30, and the thin-film encapsulating layer 17 between before and after the laser irradiation shall be described. FIG. 4 and FIG.

5 are cross-sectional schematic views of the organic EL device 1 which has not been irradiated with a laser and the organic EL device 1 which has been irradiated with a laser.

FIG. 4 is an enlarged cross-sectional view of a configuration of the organic EL device 1, illustrating a configuration of the cathode 16 near the foreign material 21 in the organic EL device 1 where the foreign material 21 has been detected. As illustrated in FIG. 4, the configuration of the organic EL device 1 which has not been irradiated with a laser includes, between the electron injection layer 15 in the organic layer 30 and the cathode 16, an interface layer 20a in which the constituent material of the electron injection layer 15 in the organic layer 30 is incorporated into the constituent material of the cathode 16. This interface layer 20a is spontaneously formed to reduce stress generated by a difference between the constituent material of the electron injection layer 15 in the organic layer 30 and the constituent material of the cathode 16. Likewise, at a boundary between the cathode 16 and the thin-film encapsulating layer 17, an interface layer 20b is formed in which the constituent material of the thin-film encapsulating layer 17 is incorporated into the constituent material of the cathode 16. This interface layer 20b is spontaneously formed to reduce stress generated by a difference between the constituent material of the cathode 16 and the constituent material of the thin-film encapsulating layer 17. The interface layers 20a and 20b each have a thickness of approximately 5 to 15 nm, for example.

Figure 5:
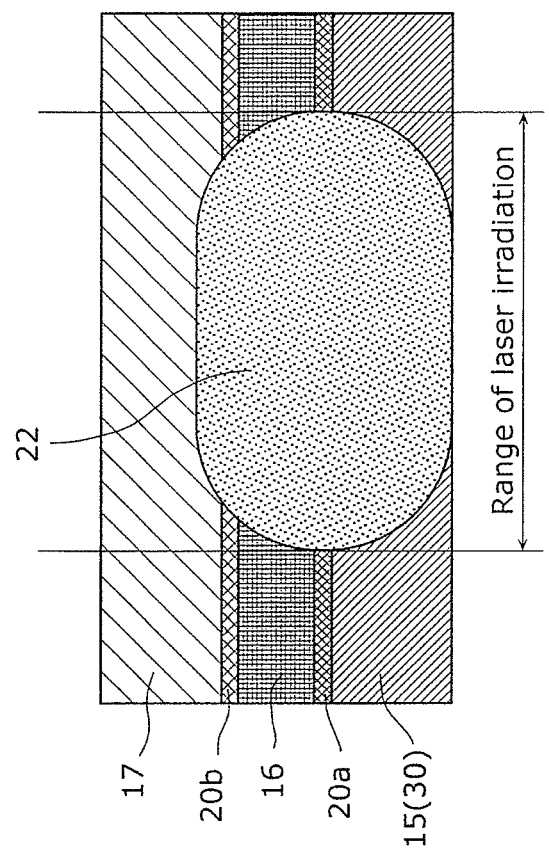
FIG. 5 is a partial cross-sectional view of an organic EL device which has been irradiated with a laser in Embodiment 1.

In the configuration of the organic EL device 1 which has been irradiated with a laser, the mixed layer 22 in which the cathode 16 and at least one of the organic layer 30 and the thin-film encapsulating layer 17 are mixed is formed as illustrated in FIG. 5. This mixed layer 22 is a layer in which the constituent materials of the cathode 16, the organic layer 30, and the thin-film encapsulating layer 17 are mixed across a wider range in the depth direction than the above-described interface layers 20a and 20b, and is a layer newly formed by laser irradiation, which is different from the interface layers 20a and 20b. it is conceived that the resistance value of the mixed layer 22 is high because the density of a conductive material (metal atoms) included in the cathode 16 is low due to the presence of the constituent materials of the cathode 16, the organic layer 30, and the thin-film encapsulating layer 17 in mixture. Note that the mixed layer 22 has a thickness of approximately 50 to 300 nm, for example.

Figure 6:
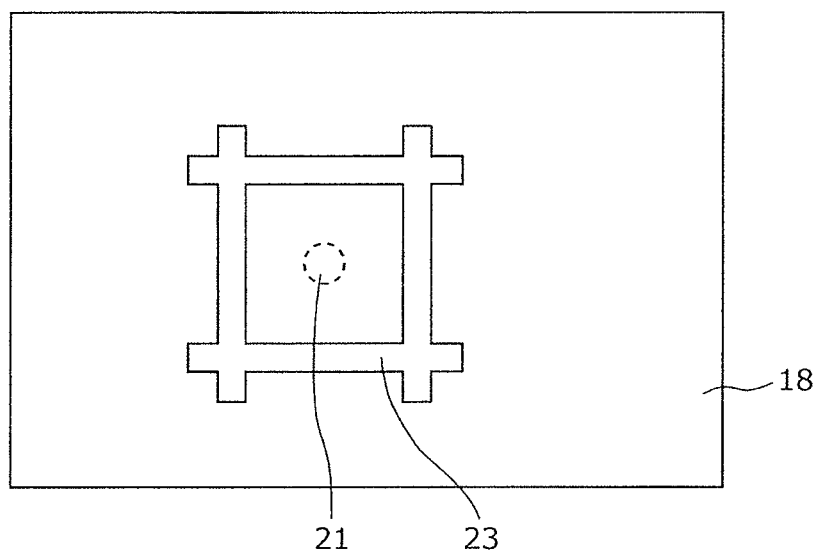
FIG. 6 is a top view of an organic EL device for indicating a position of laser irradiation.
Figure 7:
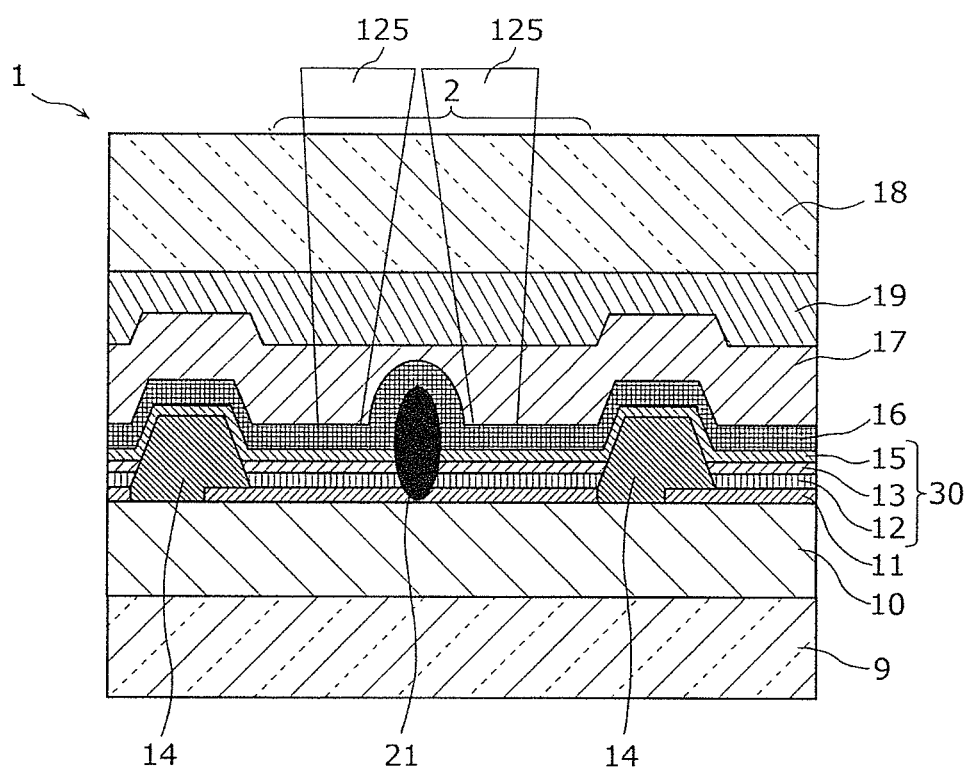
FIG. 7 is a cross-sectional schematic view illustrating a process of fixing a short of the organic EL device.
Figure 8:
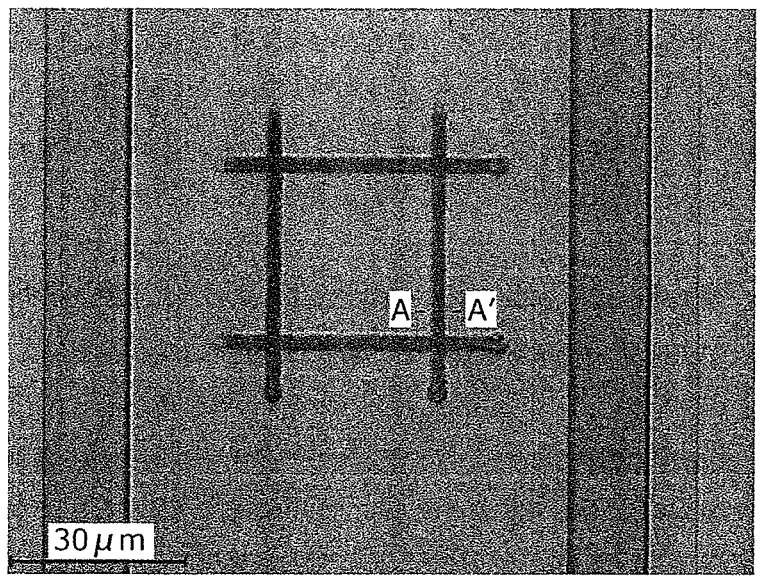
FIG. 8 is an SEM image capturing the top surface of the organic EL device which has been irradiated with a laser.
Figure 9:
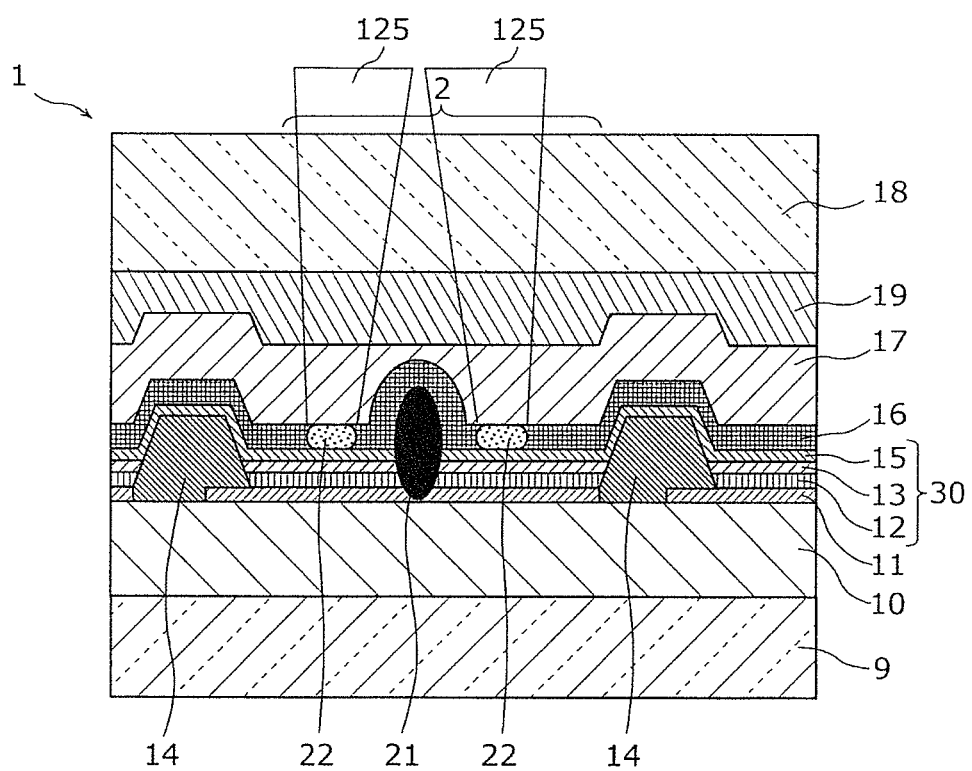
FIG. 9 is a cross-sectional schematic view illustrating a process of fixing a short of the organic EL device.

FIG. 6 is a top view of the organic EL device 1 for indicating a position of laser irradiation. FIG. 7 is a cross-sectional schematic view illustrating a process of fixing a short of the organic EL device. FIG. 8 is an SEM image capturing the top surface of the organic EL device 1, for indicating the position of laser irradiation shown in FIG. 6. FIG. 9 is a cross-sectional schematic view of the organic EL element 1 in which an area around the part where the anode 11 and the cathode 16 are shorted has been irradiated with a laser. FIG. 7 and FIG. 9 are cross-sectional schematic views illustrating the process of fixing the short of the organic EL device 1; FIG. 7 illustrates a cross-sectional schematic view of the organic EL device 1 which has not been irradiated with a laser 125, and FIG. 9 illustrates a cross-sectional schematic view of the organic EL device 1 which has been irradiated with the laser 125.

In this embodiment, the cathode 16 in a predetermined region around the foreign material 21 is irradiated with the laser 125. For example, as illustrated in FIG. 6 and FIG. 7, the cathode 16 at the approximately 10 μm-distant region around the foreign material 21 is irradiated with the laser which surrounds the foreign material 21 by four sides, that is, in shape of a 20 μm×20 μm square. Here, the laser to be used is an ultrashort pulse laser. The ultrashort pulse laser refers to a laser the pulse width of which is a few picoseconds to a few femtoseconds; specifically, the laser preferably has a pulse width of 100 fs to 20 ps. As an example, in this embodiment, an ultrashort pulse laser having a pulse width of 800 fs (which is generally referred to also as a femtosecond laser) is used. The wavelength of the laser is 900 to 2,500 nm and the output energy thereof is 1 to 50 μJ, for example. FIG. 8 is an SEM image, captured by a scanning electron microscope (SEM), of the top surface of the organic EL device 1 to which the laser has been emitted in the pattern illustrated in FIG. 6.

The irradiation with the laser 125 as illustrated in FIG. 6 and FIG. 8 will form, as illustrated in FIG. 9, the mixed layer 22 in which the cathode 16 at the part irradiated with the laser 125 and at least one of (i) the constituent material of the organic layer 30 and (ii) the constituent material of the thin-film encapsulating layer 17 are mixed, with the result that the short between the anode 11 and the cathode 16 is fixed.

When the cathode 16 in the predetermined region including the foreign material 21 is irradiated with the laser 125, there is a possibility that the foreign material 21 absorbs the energy of the laser 125 and shakes, causing damage to the pixel 2. In contrast, as described in this embodiment, by setting the focus of the laser 125 on the cathode 16 at a part around the foreign material 21, it is possible to increase the resistance of a part around the foreign material 21 while reducing the occurrence of absorption of the energy of the laser 125 into the foreign material 21 and thereby reducing the damage. Note that in the case where the power of the laser upon the irradiation is small, there is presumably a low possibility that the shakes of the foreign material 21 give damage to the pixel 2 even when the cathode 16 in the predetermined region including the foreign material 21 is irradiated with the laser.

Figure 10:
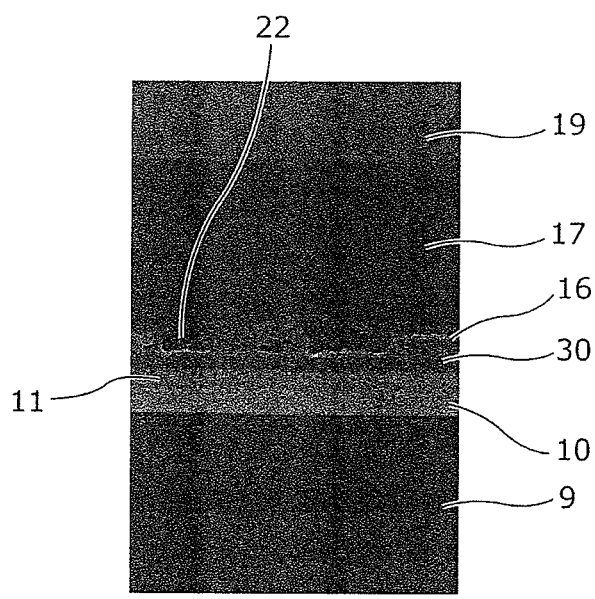
FIG. 10 is an SEM image in which the state of a cross-section of the organic EL device which has been irradiated with a laser is observed.

FIG. 10 is an SEM image, observed by a scanning electron microscope (SEM), of a cross-section of the organic EL device 1 in which the short has been fixed by laser irradiation, and is a cross-sectional SEM image along the A-A' line shown in FIG. 8. In the region not irradiated with the laser, the organic EL device 1 includes, in the order from above in the SEM image shown in FIG. 10, the encapsulating resin layer 19, the thin-film encapsulating layer 17, the cathode 16, the organic layer 30 (the electron injection layer, the light-emitting layer, and the hole injection layer), the anode 11, the planarizing film 10, and the transparent glass 9. Furthermore, in the region of the organic EL device 1 irradiated with the laser 125 (the central part in FIG. 10), it is observed that the mixed layer 22 is formed in which the constituent materials of the cathode 16, the organic layer 30, and the thin-film encapsulating layer 17 are mixed. It is conceived that as a result of the mixed layer 22 being formed, a current flows less easily and the resistance is higher because the constituent materials are dispersed.

Figure 11A:
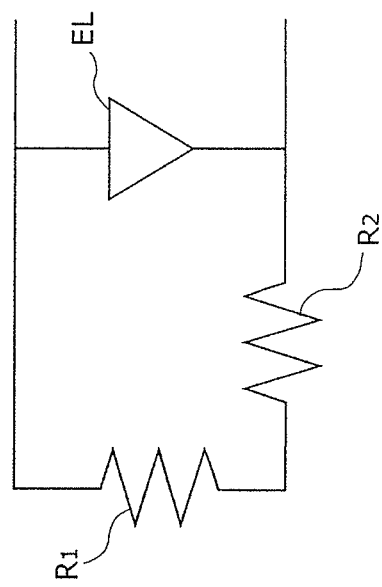
FIG. 11A is an equivalent circuit schematic of an organic EL device in which a mixed layer is formed.
Figure 11B:
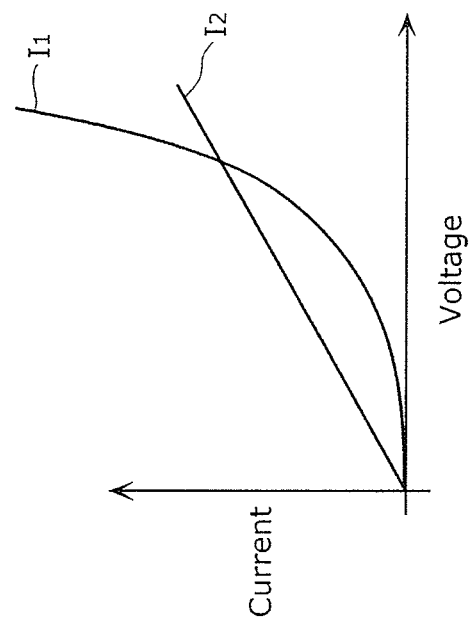
FIG. 11B is a graph showing current-voltage characteristics in the equivalent circuit schematic illustrated in FIG. 11A.

Here, the point that the short is fixed due to the mixed layer 22 being formed shall be described with reference to the configuration of an equivalent circuit of the organic EL device 1 illustrated in FIG. 11A and FIG. 11B. FIG. 11A is an equivalent circuit schematic illustrating a positional relationship of the organic layer 30, the foreign material 21, and the mixed layer 22 in the organic EL device 1 in which the mixed layer 22 is formed. FIG. 11B shows current-voltage characteristics in the equivalent circuit schematic illustrated in FIG. 11A.

As illustrated in FIG. 11A, the organic EL device 1 in which the mixed layer 22 is formed is represented by an equivalent circuit in which a resistor R1 formed of the foreign material 21 and a resistor R2 formed of the mixed layer 22 are connected directly to each other, and a resistor EL formed of the organic layer 30 is connected in parallel to the series connection of the resistors R1 and R2. In such a circuit, as the resistance of the resistor R2 formed of the mixed layer 22 increases, the combined resistance of the resistors R1 and R2 increases and the current which flows through the resistors R1 and R2 decreases. This means that, by forming the high-resistant mixed layer 22 in the organic EL device 1, it is possible to reduce the current which flows through the foreign material 21.

As shown in FIG. 11B, suppose that the value of current flowing through the organic layer 30 is denoted by $I_1$ and the value of current flowing through the resistors R1 and R2 is denoted by $I_2$, then the values of current $I_1$ flowing through the organic layer 30 are plotted in a non-linear fashion whereas the values of current $I_2$ flowing through the resistors R1 and R2 are plotted in a linear fashion. Here, it is conceived that when the value of current $I_1$ flowing through the organic layer 30 is greater than the value of current $I_2$ flowing through the resistors R1 and R2, the organic layer 30 emits light without being affected by the foreign material 21.

Furthermore, the resistance value (the sheet resistance value) of the cathode 16 is 50 ohms per square, for example, and the resistance value of the mixed layer 22 is 100 Megaohms per square, for example. Note that the resistance value of the mixed layer 22 needs to be a resistance value greater than the resistance value of the organic layer 30, and since the resistance value of the organic layer 30 is 1 Mega-ohm per square or more, the resistance value of the mixed layer 22 is desirably 1 Mega-ohm per square or more.

Thus, the mixed layer 22 is formed to increase the resistance of the cathode 16 and the organic layer 30 and the thin-film encapsulating layer 17 which are adjacent to the cathode 16. As a result, at the mixed layer 22, the short between the anode 11 and the cathode 16 is fixed, leading to the recovery of light emission from the pixel 2.

Figure 12A:
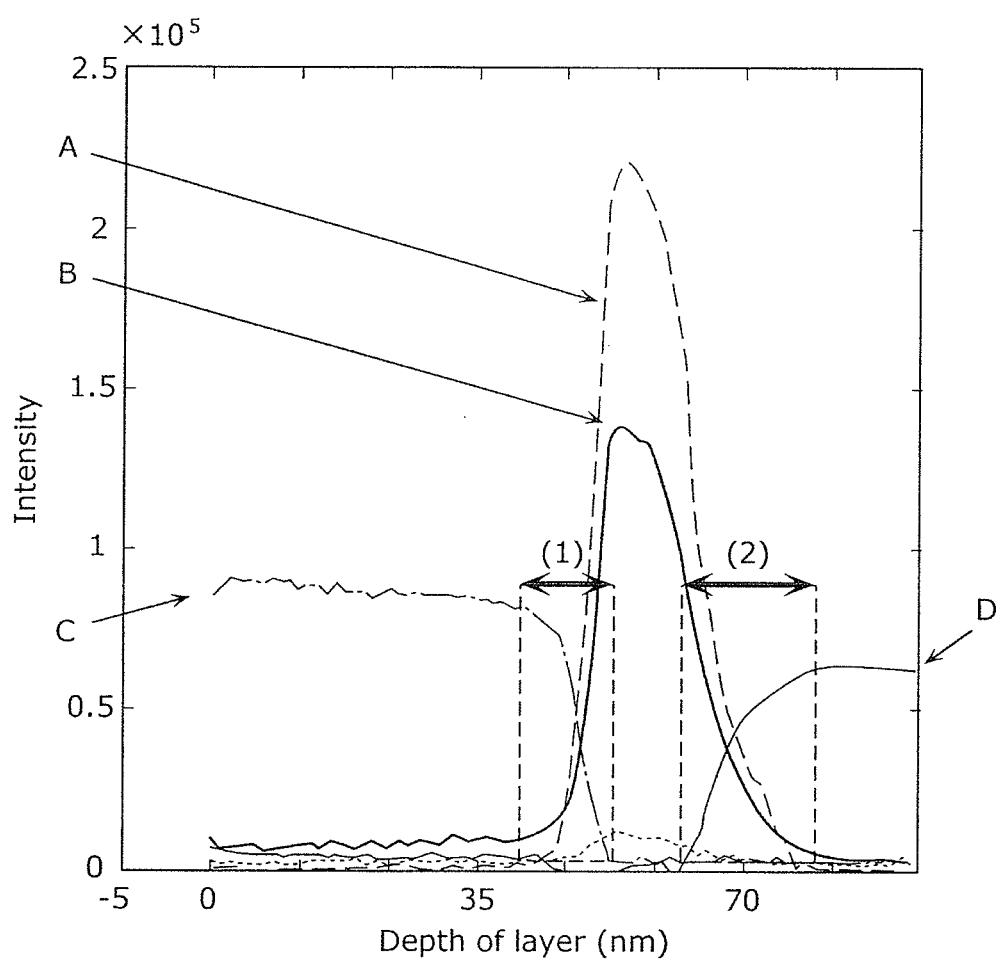
FIG. 12A shows a measurement result obtained by Auger spectroscopy for elemental analysis on the composition of an organic EL device 1 which has not been irradiated with a laser.
Figure 12B:
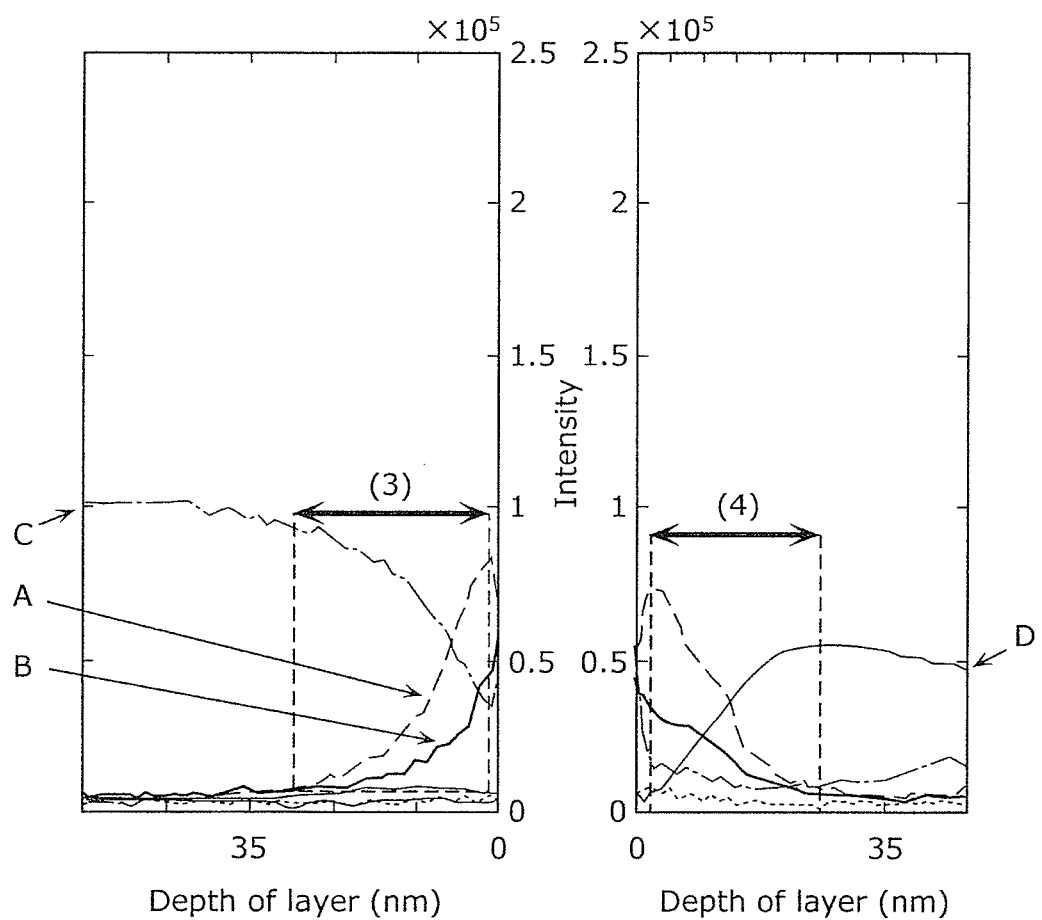
FIG. 12B shows a measurement result obtained by Auger spectroscopy for elemental analysis on the composition of an organic EL device 1 which has been irradiated with a laser.

FIG. 12A and FIG. 12B show measurement results obtained by Auger spectroscopy for elemental analysis on the compositions of the organic EL devices 1 one of which has not been irradiated with a laser and the other of which has been irradiated with a laser. Here, in each of FIG. 12A and FIG. 12B, a graph A represents In atoms, a graph B represents O atoms, a graph C represents C atoms, and a graph D represents N atoms, and higher intensity in each graph indicates higher content. On the right side of a point at which the intensity of the graph D is high, the thin-film encapsulating layer 17 is located, on the left side of a point at which the intensity of the graph C is high, the organic layer 30 is located, and at a point at which the intensity of the graph A and the intensity of the graph B are high, the cathode 16 is located.

As shown in FIG. 12A, the measurement results for the cathode 16, the organic layer 30, and the thin-film encapsulating layer 17 which have not been irradiated with a laser (or a part not irradiated with a laser) show that, in the organic layer 30, carbon atoms (C) which are the constituent material of the organic layer 30 are detected, but nitrogen atoms (N) which are an element of the constituent material SiN of the thin-film encapsulating layer 17 are not detected. Furthermore, in the thin-film encapsulating layer 17, carbon atoms (C) are not detected, but nitrogen atoms (N) are detected. Moreover, before the laser irradiation, the interface layer 20a (the thickness of the interface layer 20a corresponds to (1) in FIG. 12A) is present between the organic layer 30 and the cathode 16, and the interface layer 20b (the thickness of the interface layer 20b corresponds to (2) in FIG. 12A) is present between the cathode 16 and the thin-film encapsulating layer 17, but the mixed layer 22 has not been formed.

On the other hand, as shown in FIG. 12B, the measurement results obtained by Auger spectroscopy for elemental analysis likewise on the compositions of the constituent materials of the cathode 16, the organic layer 30, and the thin-film encapsulating layer 17 which have been irradiated with a laser (or a part irradiated with a laser) show that, in the organic layer 30, not only carbon atoms (C) which are the constituent material of the organic layer 30 are detected, but also nitrogen atoms (N) which are an element of the constituent material SiN of the thin-film encapsulating layer 17 are detected and moreover, also in the thin-film encapsulating layer 17, not only nitrogen atoms (N) are detected, but also carbon atoms (C) are detected. Furthermore, at the boundary between the organic layer 30 and the cathode 16 and at the boundary between the cathode 16 and the thin-film encapsulating layer 17, the region in which the atoms are mixed is small, as defined by steep slopes, before the laser irradiation whereas the region in which the atoms are mixed is larger after the laser irradiation.

This shows that the cathode 16, the constituent material of the organic layer 30, and the constituent material of the thin-film encapsulating layer 17 are dispersed to form the mixed layer 22 (the thickness of the mixed layer 22 corresponds to (3)+(4) in FIG. 12B) after the laser irradiation (or in the part irradiated with a laser).

Here, the laser 125 to be emitted is of a kind represented by the above-mentioned ultrashort pulse laser, and has a pulse width of 800 fs, output energy of 1 to 50 μJ, and a laser wavelength of 900 to 2,500 nm, for example. A preferred range of the wavelength of the laser can be determined depending on a material of the reflective electrode (the anode 11); in the case of an Al-based material, it is good to use a frequency around 1,550 nm, and in the case of an Ag-based material (such as APC), it is good to use a frequency of 900 to 1,550 nm. Note that the pulse width is not limited to the above-mentioned 800 fs and may be changed within the preferred range of 100 fs to 20 ps.

The output energy of the laser 125 is not limited to the above-stated range and may be any output energy as long as the mixed layer 22 is formed and the thin-film encapsulating layer 17 does not break.

The heat energy of the laser emitted to a region 23 may spread to an area around the region 23, for example, approximately 1 μm away from the position at which the laser is emitted, with the result that in this area, the mixed layer 22 will be formed, causing an increase in the resistance. Also in this case, the short between the anode 11 and the cathode 16 is fixed, leading to the recovery of light emission from the pixel 2.

In addition, the laser 125 is not emitted exclusively to the cathode 16, but may be emitted to the anode 11 with a laser focus position adjusted. Furthermore, the laser is not emitted exclusively from the transparent glass 18 side, but may be emitted from the transparent glass 9 side.

Variation of Embodiment 1

Next, Variation of Embodiment 1 shall be described.

Figure 13:
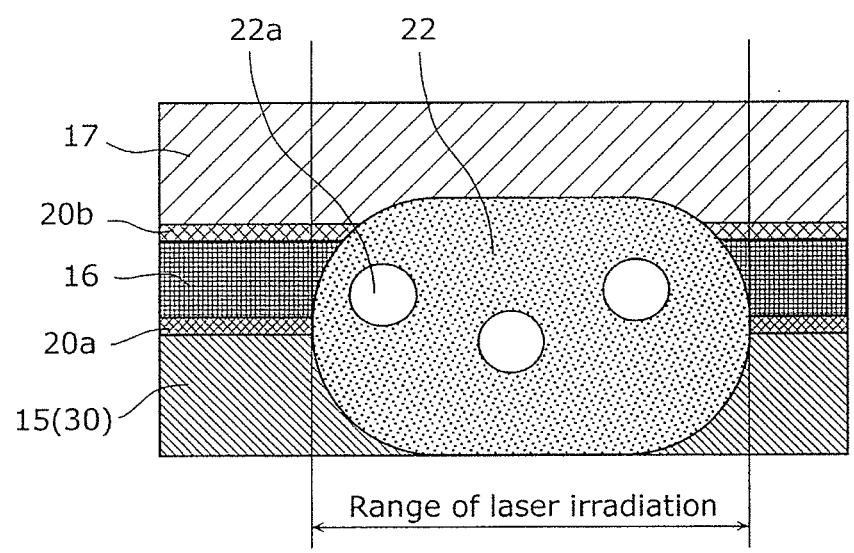
FIG. 13 is a partial cross-sectional view of an organic EL device which has been irradiated with a laser in Variation of Embodiment 1.

FIG. 13 is a partial cross-sectional view of an organic EL device which has been irradiated with a laser in this Variation. As illustrated in FIG. 13, cavities 22a are generated in the mixed layer 22 formed by laser irradiation. Each of these cavities 22a is generated presumably as a result of gasification of at least one of the cathode 16, the organic layer 30, and the thin-film encapsulating layer 17, depending on the intensity of power of the laser emitted.

Thus, it is conceived that due to the cavity 22a generated in a part of the mixed layer 22, a current flows through the mixed layer 22 less easily, leading to higher resistance, than the cathode 16 in a part where the mixed layer 22 has not been formed. Thus, the laser power may be adjusted to form a mixed layer which has the cavity 22a.

Furthermore, in a part of the cavities 22a, at least one of (i) the constituent material of the organic layer 30 and (ii) the constituent material of the thin-film encapsulating layer 17 may be present.

Embodiment 2

Next, Embodiment 2 shall be described. In this embodiment, the irradiation region in the organic EL device 50 irradiated with the laser is different from Embodiment 1.

Figure 14:
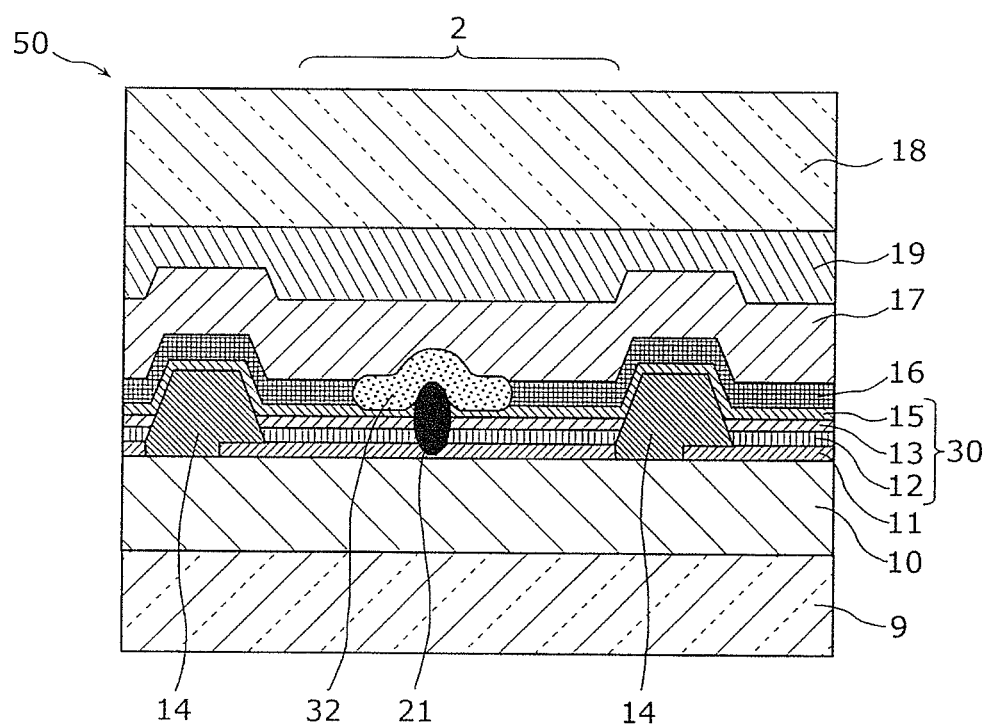
FIG. 14 is a cross-sectional schematic view of an organic EL device according to Embodiment 2.

FIG. 14 is a cross-sectional schematic view of the organic EL device 50 according to this embodiment. The organic EL device 50 illustrated in FIG. 14 includes the planarizing film 10, the anode 11, the hole injection layer 12, the light-emitting layer 13, the bank 14, the electron injection layer 15, the cathode 16, the thin-film encapsulating layer 17, the encapsulating resin layer 19, and the transparent glass 18 above the transparent glass 9 in the same manner as the organic EL device 1 illustrated in Embodiment 1. Since the configuration is identical to Embodiment 1, the description shall be omitted. Note that just as in Embodiment 1, the hole injection layer 12, the light-emitting layer 13, and the electron injection layer 15 are collectively referred to as an organic layer 30 also in this embodiment. Furthermore, when the hole transport layer and the electron transport layer are included, these layers are included in the organic layer 30 as well. Furthermore, the planarizing film 10, the anode 11, the organic layer 30, the cathode 16, the thin-film encapsulating layer 17, and the transparent glass 18 arranged in the light-emitting region isolated by the bank 14 are referred to as the pixels 2. Here, in the case of the organic EL device 50 including color filters, the color filters are formed on the main surface of the transparent glass 18 in advance. Subsequently, the transparent glass 18 is placed on the encapsulating resin layer 19 applied, with the surface on which the color filters are formed facing downward. Note that the thin-film encapsulating layer 17, the encapsulating resin layer 119, and the transparent glass 18 correspond to the protective film.

In the configuration illustrated in FIG. 14, the laser 125 is emitted to a predetermined region including the foreign material 21, so as to form the mixed layer 22 in which the cathode 16 and at least one of (i) the constituent material of the organic layer 30 and (ii) the constituent material of the thin-film encapsulating layer 17 are mixed, causing an increase in the resistance, with the result that the short between the anode 11 and the cathode 16 is fixed.

Next, the process of fixing the short caused by the foreign material 21 shall be described with the reference to FIG. 15 to FIG. 18.

Figure 15:
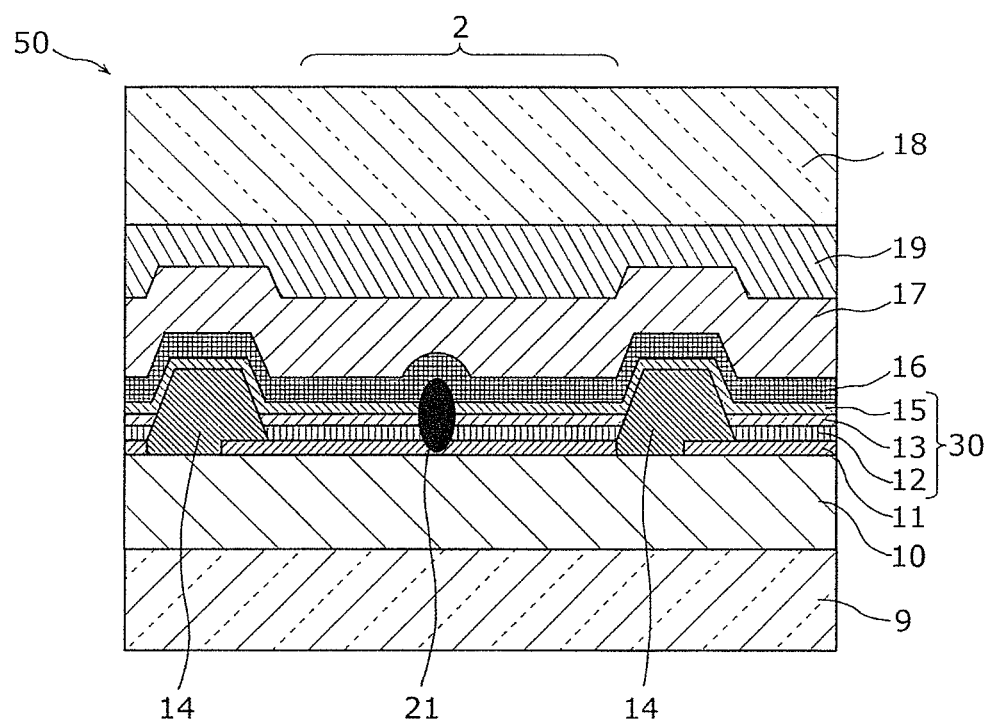
FIG. 15 is a cross-sectional schematic view illustrating a process of fixing a short of the organic EL device.
Figure 16:
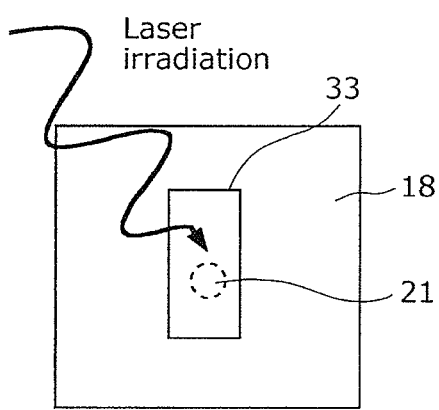
FIG. 16 is a top view of an organic EL device for illustrating a position of laser irradiation.
Figure 17:
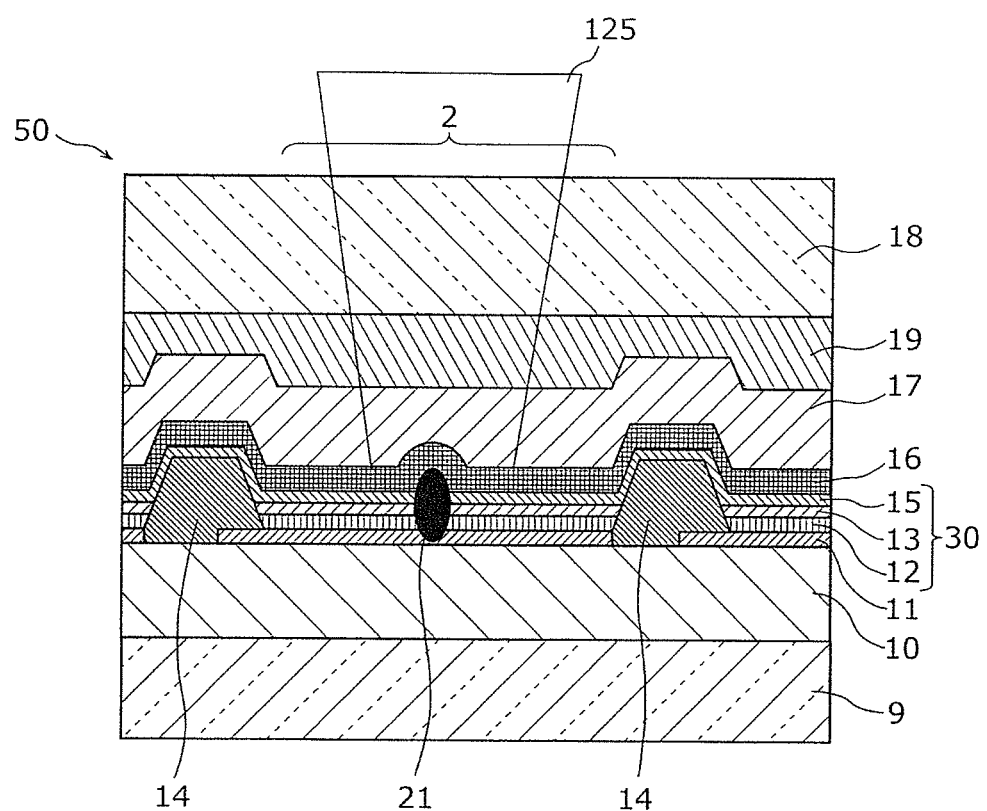
FIG. 17 is a cross-sectional schematic view illustrating a process of fixing a short of the organic EL device.
Figure 18:
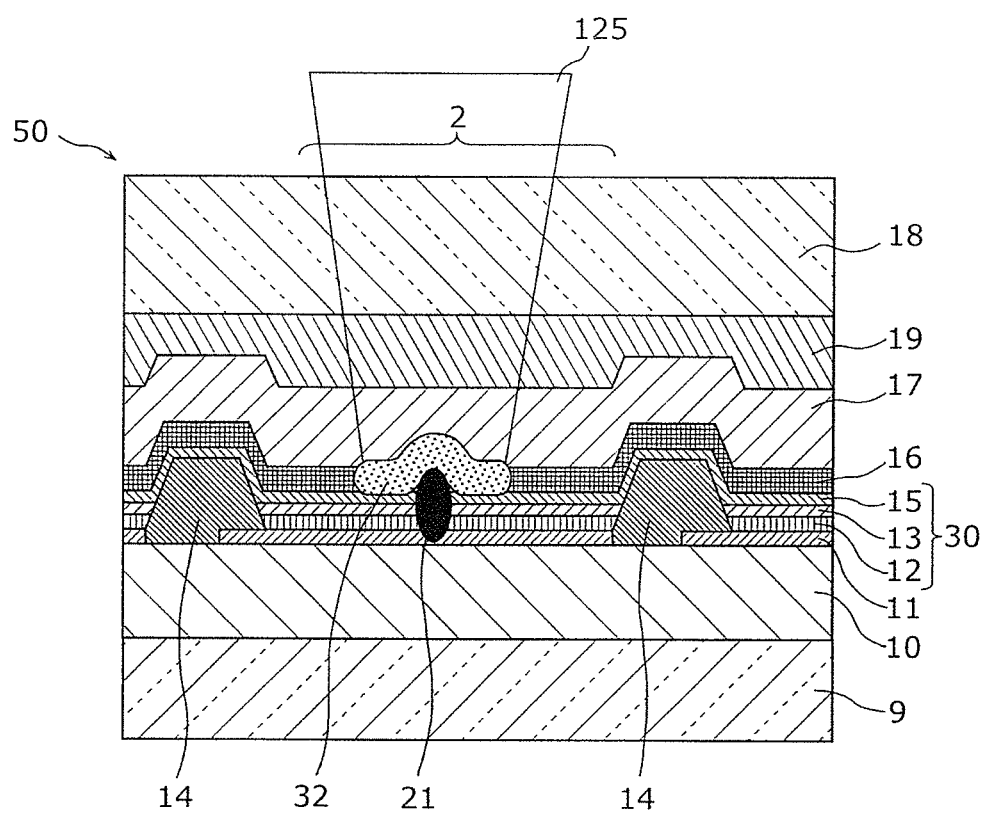
FIG. 18 is a cross-sectional schematic view illustrating a process of fixing a short of the organic EL device.

FIG. 15 is a cross-sectional schematic view illustrating a process of fixing a short of the organic EL device. FIG. 16 is a top view of the organic EL device 50 for illustrating a region irradiated with the laser 125 for the foreign material 21. FIG. 17 and FIG. 18 are each a cross-sectional schematic view illustrating a process of fixing a short of the organic EL device 50.

As in the case of Embodiment 1, a shorted part 121 is repaired through the laser irradiation using the laser 125. After the foreign material 21 is detected, the part where the anode 11 and the cathode 16 are shorted by the foreign material 21 and a region around the part are irradiated with the laser 125. In FIG. 16, a region 33 surrounded by a solid line indicates the range to be irradiated with the laser 125. As illustrated in FIG. 16, the cathode 16 in the region 33 of 5 µm×10 µm, for example, is irradiated with the laser 125. Note that the focus of the laser 125 is set according to the cathode 16.

When the laser 125 is emitted as illustrated in FIG. 17, a resistance-increased mixed layer 32 in which the cathode 16 and at least one of (i) the constituent material of the organic layer 30 and (ii) the constituent material of the thin-film encapsulating layer 17 are mixed is formed in the region 33 irradiated with the laser 125 as illustrated in FIG. 18. Thus, this is a configuration in which the short between the anode 11 and the cathode 16 has been fixed.

As above, the resistance of the cathode 16 in the range surrounding the foreign material 21 and irradiated with the layer 125 increases as a result of the mixed layer 32 being formed. With this, the short between the anode 11 and the cathode 16 is fixed, leading to the recovery of light emission from the pixel 2.

Note that the kind, wavelength, and output energy of the laser 125 may be changed to any other kinds, wavelengths, and output energy as long as the mixed layer 32 is formed and the thin-film encapsulating layer 17 does not break, as in the above-described case of Embodiment 1. In addition, as in the case of Embodiment 1, a process of detecting the position of the foreign material 21 may be included before the process of repairing.

Embodiment 3

Next, Embodiment 3 according to the present invention shall be described. This embodiment is different from the above-described Embodiment 1 in that a shorted part in the organic EL device in which the anode and the cathode directly contact each other without any conductive foreign materials in between is repaired.

Figure 19:
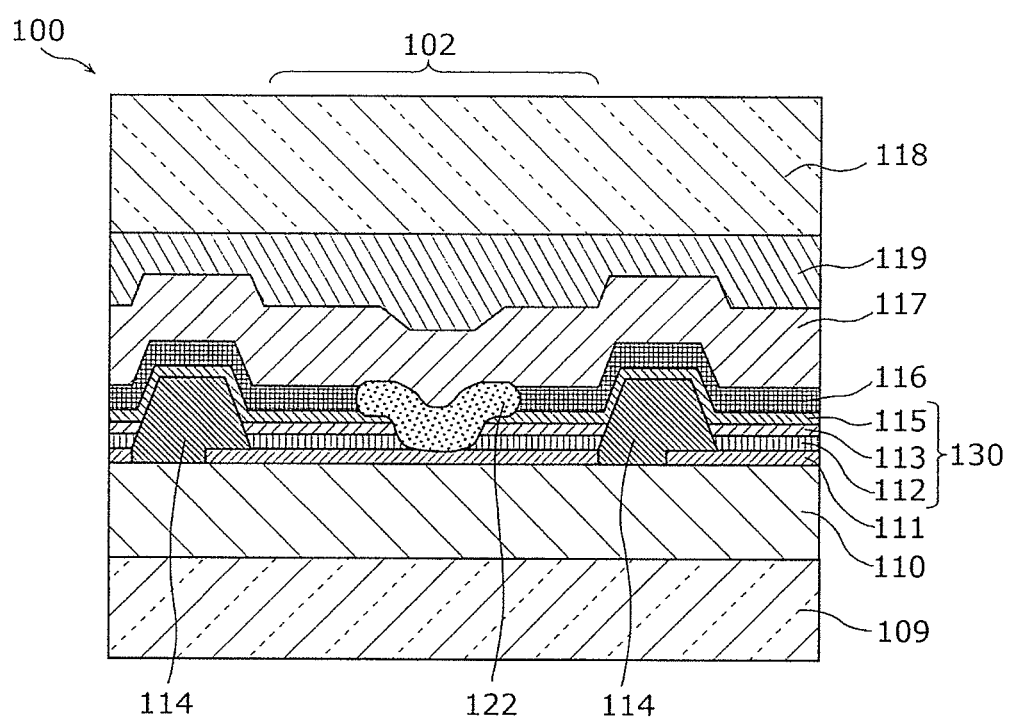
FIG. 19 is a cross-sectional schematic view of an organic EL device according to Embodiment 3.

FIG. 19 is a cross-sectional schematic view of an organic EL device 100 according to this embodiment. The organic EL device 100 illustrated in FIG. 19 includes a planarizing film 110, an anode 111, a hole injection layer 112, a light-emitting layer 113, a bank 114, an electron injection layer 115, a cathode 116, a thin-film encapsulating layer 117, an encapsulating resin layer 119, and a transparent glass 118 above a transparent glass 109 in the same manner as the organic EL device 1 illustrated in Embodiment 1. Since the configuration is identical to Embodiment 1, the description shall be omitted. Note that just as in Embodiment 1, the hole injection layer 12, the light-emitting layer 113, and the electron injection layer 115 are collectively referred to as an organic layer 130 also in this embodiment. Furthermore, when the hole transport layer and the electron transport layer are included, these layers are included in the organic layer 130 as well. Furthermore, the planarizing film 110, the anode 111, the organic layer 130, the cathode 116, the thin-film encapsulating layer 117, and the transparent glass 118 arranged in the light-emitting region isolated by the bank 114 are referred to as the pixels 102. Here, in the case of the organic EL device 100 including color filters, the color filters are formed on the main surface of the transparent glass 118 in advance. Subsequently, the transparent glass 118 is placed on the encapsulating resin layer 119 applied, with the surface on which the color filters are formed facing downward. Note that the thin-film encapsulating layer 117, the encapsulating resin layer 119, and the transparent glass 118 correspond to the protective film.

In FIG. 19, the anode 111 and the cathode 116 are directly in contact with each other at a part of the cathode. This direct contact is caused, for example, due to a pin hole being formed at the shorted part in the process of forming the organic layer 130, followed by the process of forming the cathode 116 during which a material composing the cathode 116 flows into the pin hole when the cathode 116 is formed. Subsequently, in the configuration, a mixed layer 122 in which the cathode 116 and at least one of (i) the constituent material of the organic layer 130 and (ii) the constituent material of the thin-film encapsulating layer 117 are mixed is formed, causing an increase in the resistance, with the result that the short between the anode 111 and the cathode 116 is fixed.

Next, the process of fixing the short of the above-described shorted part 121 in which the anode 111 and the cathode 116 are shorted shall be described with reference to FIG. 20 to FIG. 22.

Figure 20:
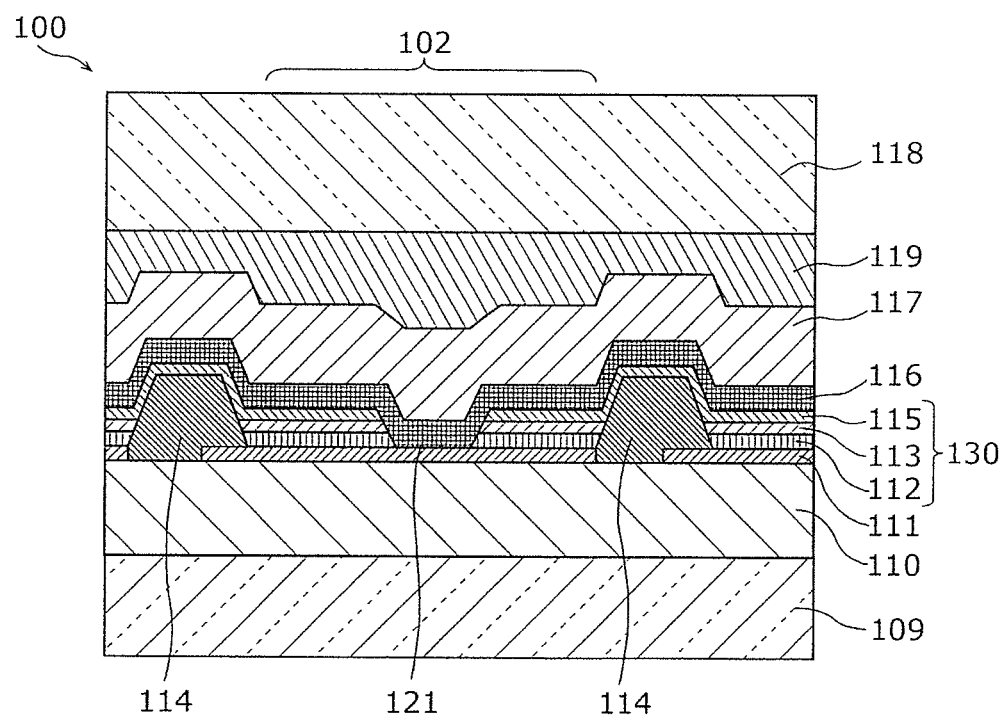
FIG. 20 is a cross-sectional schematic view illustrating a process of fixing a short of the organic EL device.
Figure 21:
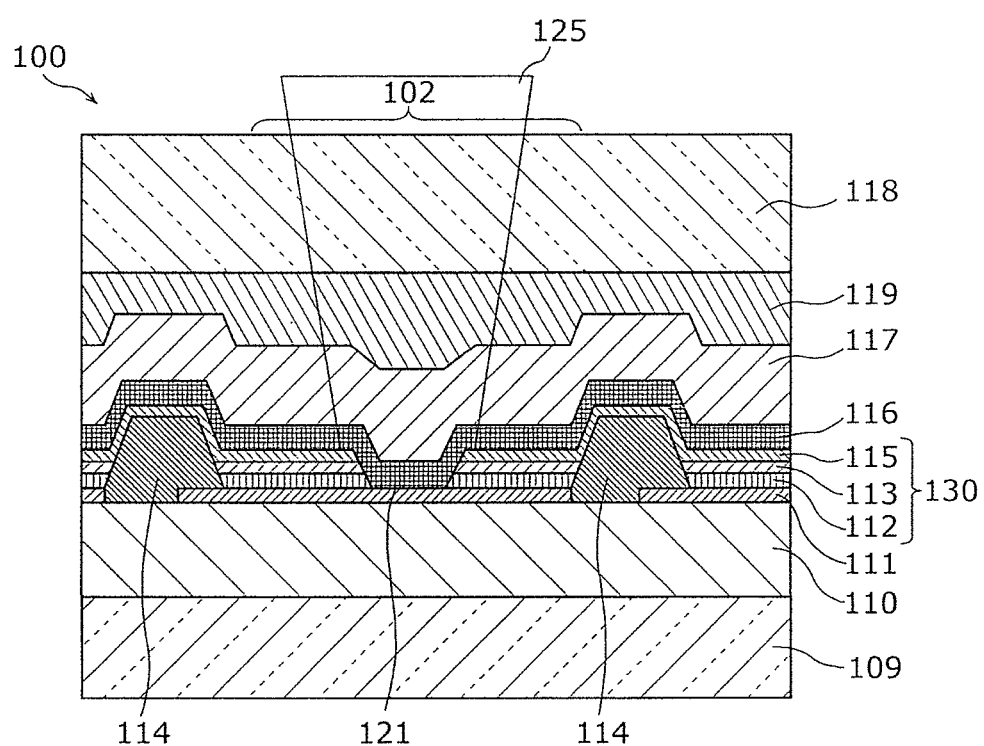
FIG. 21 is a cross-sectional schematic view illustrating a process of fixing a short of the organic EL device.
Figure 22:
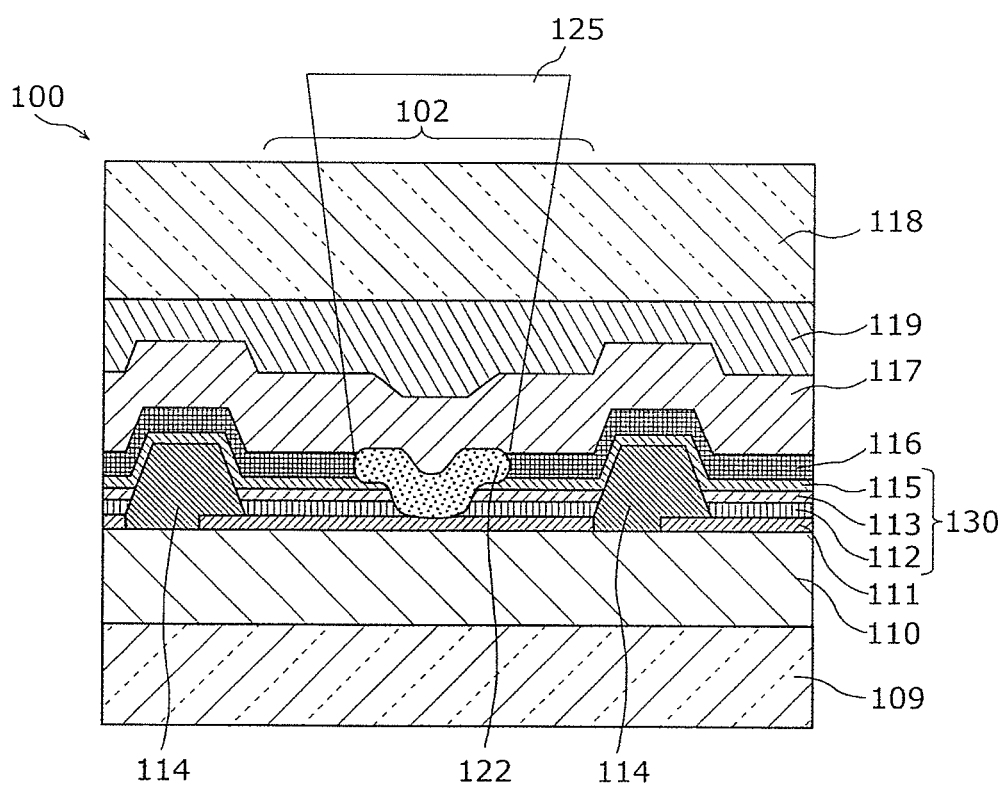
FIG. 22 is a cross-sectional schematic view illustrating a process of fixing a short of the organic EL device.

FIG. 20 to FIG. 22 are each a cross-sectional schematic view illustrating a process of fixing a short of the organic EL device. FIG. 20 is a cross-sectional schematic view of the organic EL device 100 which has not bee repaired, FIG. 21 is a cross-sectional schematic view of the organic EL device 100 which is being irradiated with the laser 125, and FIG. 22 is a cross-sectional schematic view of the organic EL device 100 which has been repaired.

As in the case of Embodiment 1, the shorted part 121 is repaired by emitting the laser 125 to the cathode 116 near the shorted part 121. Specifically, inside the pixel 102 including the shorted part 121 as illustrated in FIG. 20, the laser 125 is emitted from the transparent glass 118-side to the cathode 116 near the shorted part 121 as illustrated in FIG. 21. By doing so, the mixed layer 122 is formed in which the cathode 116 and at least one of (i) the constituent material of the organic layer 30 and (ii) the constituent material of the thin-film encapsulating layer 117 are mixed. It is conceived that the mixed layer 122 less easily allows a current to flow and has higher resistance as compared to the cathode 116 in a part where the mixed layer 122 has not been formed. Thus, a part of the cathode 116 has increased resistance so that the short between the anode 111 and the cathode 116 is fixed, leading to the recovery of light emission from the pixel 102.

Here, the laser 125 to be emitted is of a kind represented by an ultrashort pulse laser having a pulse width of 800 fs, a laser wavelength of 900 to 2,500 nm, and output energy of 1 to 50 µJ, for example.

Note that the region to be irradiated with the laser 125 is not limited to the region including the shorted part 121 and may be a region which surrounds the shorted part as illustrated in Embodiment 1.

There is a case where the heat energy of the laser 125 spreads to a certain area around the region irradiated with the laser 125, with the result that the mixed layer 122 is formed and causes an increase in the resistance in an area wider than the area irradiated with the laser 125, for example. Also in this case, the short between the anode 111 and the cathode 116 is fixed, leading to the recovery of light emission from the pixel 102.

In addition, a process of detecting the shorted part may be included before the process of repairing the shorted part 121.

Embodiment 4

Next, Embodiment 4 according to the present invention shall be described. This embodiment is different from the above-described Embodiments 1 to 3 in that the anode 11 and the cathode 16 are not fully conducted, and the resistance between the anode 11 and the cathode 16 is smaller than another part.

Figure 23:
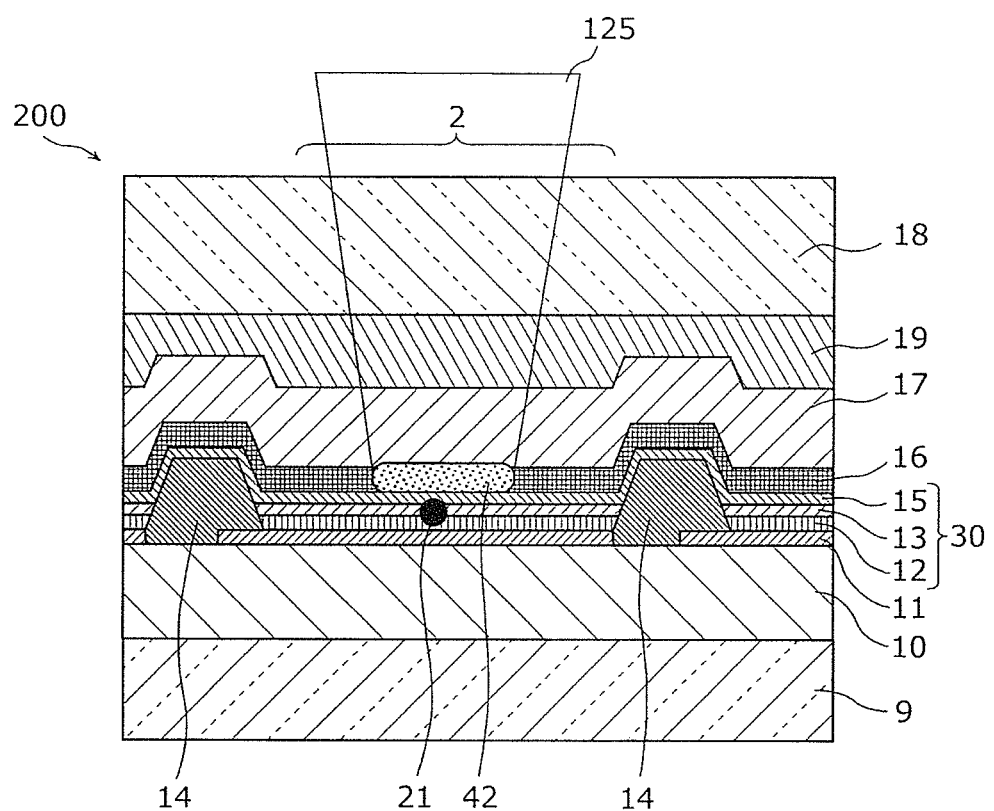
FIG. 23 is a cross-sectional schematic view of an organic EL device according to Embodiment 4.

FIG. 23 is a cross-sectional schematic view of an organic EL device 200 according to this embodiment. The size of the foreign material 21 is smaller than the sizes of the anode 11 and the cathode 16, and the foreign material 21 is not conducted to the anode 11 or the cathode 16. Since the distances between the foreign material 21 and the anode 11 and between the foreign material 21 and the cathode 16 are short, the resistance is small, making it easier for a current to flow.

As above, even when the anode 11 and the cathode 16 are not fully conducted, the short between the anode 11 and the cathode 16 can be fixed. In other words, as in Embodiment 1, the laser 125 is emitted from the transparent glass 18 side to the cathode 16 located above the shorted part so that a mixed layer 42 is formed in which the cathode 16 and at least one of (i) the constituent material of the organic layer 130 and (ii) the constituent material of the thin-film encapsulating layer 117 are mixed, causing an increase in the resistance, with the result that the short between the anode 11 and the cathode 16 can be fixed.

Figure 24:
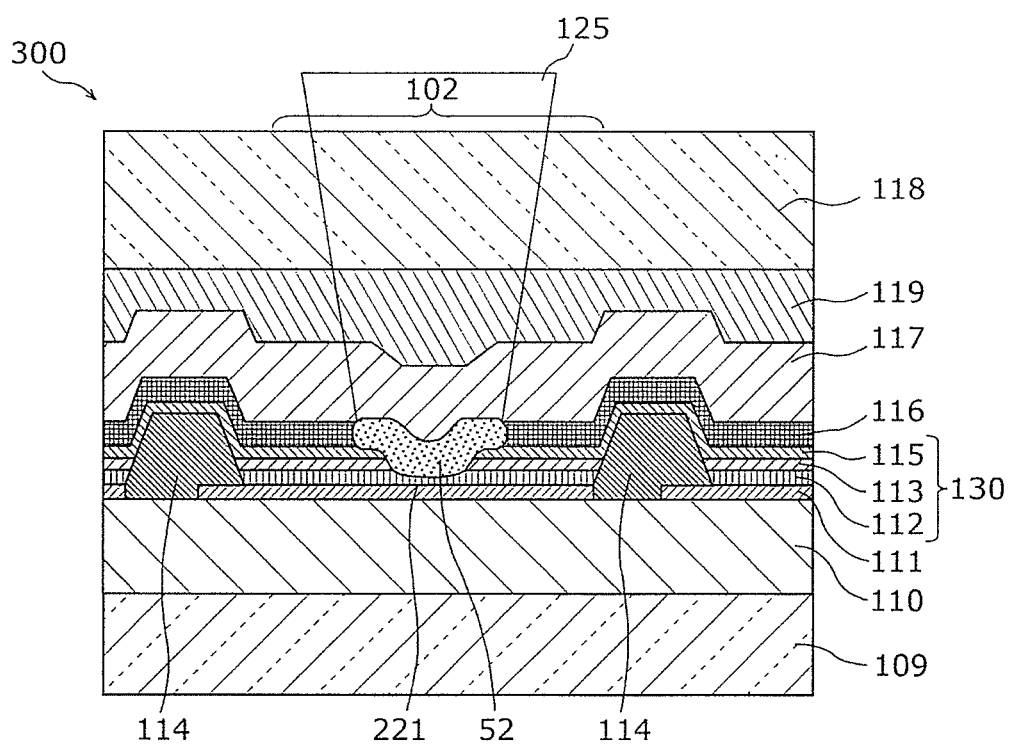
FIG. 24 is a cross-sectional schematic view of an organic EL device according to Embodiment 4.

FIG. 24 is a cross-sectional schematic view of an organic EL device 300 according to this embodiment. In FIG. 24, although the anode 111 and the cathode 116 are not conducted, the distance between the anode 111 and the cathode 116 is short, meaning that the resistance is small and in the shorted part which has not been irradiated with a laser, a current easily flows. The shorted part is formed, for example, due to a pin hole being formed at the shorted part in the process of forming the light-emitting layer 113 of the organic layer 130, followed by the process of forming the cathode 116 during which a material composing the cathode 116 flows into the pin hole when the cathode 116 is formed.

Thus, even in the case where the anode 111 and the cathode 116 are not fully conducted, it is possible to increase the resistance by emitting the laser 125 from the transparent glass 118 side to the cathode 116 at the shorted part and at least one of the organic layer 130 and the thin-film encapsulating layer 117 which are adjacent to the cathode 116, thereby forming a mixed layer 52 in which the cathode 116 and at least one of (i) the constituent material of the organic layer 130 and (ii) the constituent material of the thin-film encapsulating layer 117 are mixed as in the case of Embodiment 3. By doing so, the short between the anode 111 and the cathode 116 can be fixed.

Note that the present invention is not limited to the embodiments described above, and various modification and reformation can be made within the spirit or scope of the present invention.

For example, although the structure in which the lower electrode is the anode and the upper electrode is the cathode has been described in the above-described embodiments, the structure may be that the lower electrode is a cathode and the upper electrode is an anode. Furthermore, the structure of the organic EL device, namely, the planarizing film, the anode, the hole injection layer, the light-emitting layer, the bank, the electron injection layer, the cathode, the thin-film encapsulating layer, the encapsulating resin layer, and the transparent glass is not limited to the structure described in the above-described embodiments, and the material, configuration, and the method for forming these layers may be changed. For example, a hole transport layer may be present between the hole injection layer and the light-emitting layer, and an electron transport layer may be present between the electron injection layer and the light-emitting layer. The organic EL device may further includes a color filter for adjusting colors in red, green, and blue under the transparent glass so as to cover the light-emitting regions isolated by the bank.

Alternatively, the position of the laser irradiation is not limited to the above-described embodiments, and may be set within a certain range including the foreign material and the shorted part, or only on the foreign material or the shorted part. Alternatively, the position may be set to surround the foreign material or the shorted part. Alternatively, the laser irradiation may be performed not only on the cathode, but on the anode as well.

Figure 25:
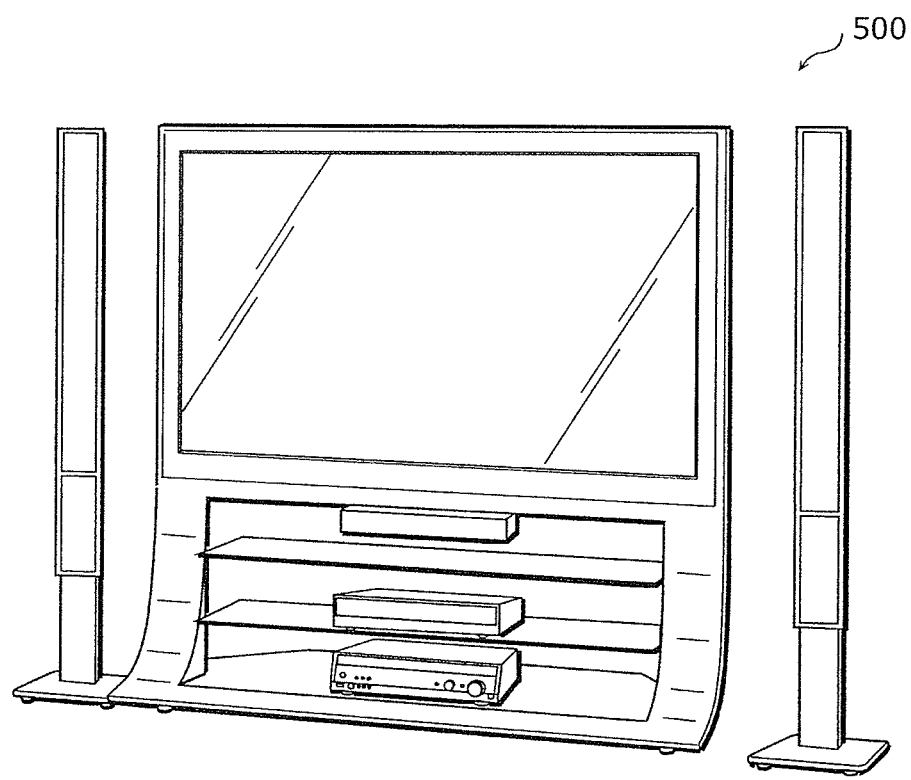
FIG. 25 illustrates an external appearance of a television system including the organic EL device.

The scope of the present invention includes an embodiment obtained by making to these embodiments various modifications which a person skilled in the art could think of, and an embodiment obtained by combining structural elements in different embodiments, unless such obtained embodiments do not depart from the principles and spirit of the present invention. For example, a thin flat-screen television system including the organic EL device according to the present invention as illustrated in FIG. 25 is included in the present invention.

INDUSTRIAL APPLICABILITY

The manufacturing method for the organic EL device and the organic EL device according to the present invention are useful particularly in a technical field of flat-screen televisions, displays for personal computers, and the like where a large screen and a high resolution are demanded.

REFERENCE SIGNS LIST 1, 50, 100, 200, 300 Organic EL device
2, 102 Pixel
11, 111 Anode (lower electrode)
12, 112 Hole injection layer (organic layer)
13, 113 Light-emitting layer (organic layer)
15, 115 Electron injection layer (organic layer)
16, 116 Cathode (upper electrode)
17, 117 Thin-film encapsulating layer (encapsulating layer)
21 Foreign material
22, 32, 42, 52, 122 Mixed layer
30, 130 Organic layer
121 Shorted part
125 Laser

The invention claimed is:

1. A method for manufacturing an organic electroluminescence device, comprising:
    preparing an organic electroluminescence device that has a shorted part and includes a lower electrode, an organic layer formed on the lower electrode, an upper electrode formed on the organic layer, and an encapsulating layer formed on the upper electrode, the shorted part being a part in which the lower electrode and the upper electrode are shorted, the organic layer including a light-emitting layer; and
    forming a mixed layer by irradiating at least one of the shorted part and a region around the shorted part with a laser, the mixed layer being a layer in which a constituent material of the upper electrode and at least one of (i) a constituent material of the organic layer and (ii) a constituent material of the encapsulating layer are mixed.

2. The method for manufacturing an organic electroluminescence device according to claim 1,
    wherein the mixed layer is formed at least at a position corresponding to the upper electrode which has not been irradiated with the laser.

3. The method for manufacturing an organic electroluminescence device according to claim 1,
    wherein the upper electrode includes a metal or a metal oxide, and
    a proportion of metal atoms in the mixed layer is lower than a proportion of metal atoms in the upper electrode which has not been irradiated with the laser.

4. The method for manufacturing an organic electroluminescence device according to claim 1,
    wherein a proportion of carbon atoms in the mixed layer is higher than a proportion of carbon atoms in the upper electrode which has not been irradiated with the laser.

5. The method for manufacturing an organic electroluminescence device according to claim 1,
    wherein the encapsulating layer includes a material containing nitrogen, and
    a proportion of nitrogen atoms in the mixed layer is higher than a proportion of nitrogen atoms in the upper electrode which has not been irradiated with the laser.

6. The method for manufacturing an organic electroluminescence device according to claim 1,
    wherein the mixed layer includes a cavity.

7. The method for manufacturing an organic electroluminescence device according to claim 6,
    wherein at least one of (i) the constituent material of the organic layer and (ii) the constituent material of the encapsulating layer is present in a part of the cavity.

8. The method for manufacturing an organic electroluminescence device according to claim 1,
    wherein a sheet resistance value of the mixed layer is 1 Mega-ohm per square or more.

9. The method for manufacturing an organic electroluminescence device according to claim 1,
    wherein the laser is an ultrashort pulse laser.

10. The method for manufacturing an organic electroluminescence device according to claim 9,
    wherein the ultrashort pulse laser has a pulse width of 100 fs to 20 ps.

11. The method for manufacturing an organic electroluminescence device according to claim 9,
    wherein the laser has a wavelength of 900 to 2,500 nm.

12. An organic electroluminescence device comprising:
    a lower electrode;
    an organic layer including a light-emitting layer and formed on the lower electrode;
    an upper electrode formed on the organic layer;
    an encapsulating layer formed on the upper electrode; and
    a mixed layer formed by laser irradiation and in which a constituent material of the upper electrode and at least one of (i) a constituent material of the organic layer and (ii) a constituent material of the encapsulating layer are mixed.

13. The organic electroluminescence device according to claim 12,
    wherein the mixed layer is formed at least at a position corresponding to the upper electrode which has not been irradiated with the laser.

14. The organic electroluminescence device according to claim 12,
    wherein the upper electrode includes a metal or a metal oxide, and
    a proportion of metal atoms in the mixed layer is lower than a proportion of metal atoms in the upper electrode.

15. The organic electroluminescence device according to claim 12,
    wherein a proportion of carbon atoms in the mixed layer is higher than a proportion of carbon atoms in the upper electrode.

16. The organic electroluminescence device according to claim 12,
   wherein the encapsulating layer includes a material containing nitrogen, and
   a proportion of nitrogen atoms in the mixed layer is higher than a proportion of nitrogen atoms in the upper electrode.

17. The organic electroluminescence device according to claim 12,
   wherein the mixed layer includes a cavity.

18. The organic electroluminescence device according to claim 17,
   wherein at least one of (i) the constituent material of the organic layer and (ii) the constituent material of the encapsulating layer is present in a part of the cavity.

19. The organic electroluminescence device according to claim 12,
   wherein a sheet resistance value of the mixed layer is 1 Mega-ohm per square or more.

* * * * *